US012279488B2

(12) United States Patent
Shi et al.

(10) Patent No.: US 12,279,488 B2
(45) Date of Patent: Apr. 15, 2025

(54) DISPLAY SUBSTRATE AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Ling Shi, Beijing (CN); Shiming Shi, Beijing (CN); Chien Pang Huang, Beijing (CN); Hao Zhang, Beijing (CN)

(73) Assignees: Chengdu BOE Optoelectronics Technology Co., Ltd., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 148 days.

(21) Appl. No.: 16/771,454

(22) PCT Filed: Jul. 31, 2019

(86) PCT No.: PCT/CN2019/098708
§ 371 (c)(1),
(2) Date: Jun. 10, 2020

(87) PCT Pub. No.: WO2021/016947
PCT Pub. Date: Feb. 4, 2021

(65) Prior Publication Data
US 2021/0408203 A1    Dec. 30, 2021

(51) Int. Cl.
*H10K 59/131*    (2023.01)
*H01L 27/12*    (2006.01)
(Continued)

(52) U.S. Cl.
CPC ......... *H10K 59/131* (2023.02); *H01L 27/124* (2013.01); *H10K 59/124* (2023.02);
(Continued)

(58) Field of Classification Search
CPC ............ H01L 27/3276; H01L 27/3216; H01L 27/3218; H01L 27/12; H10K 59/12; H10K 59/131; H10K 59/352; H10K 59/353
See application file for complete search history.

(56) References Cited

U.S. PATENT DOCUMENTS 10,304,918 B2    5/2019 Lee et al.
10,431,152 B2    10/2019 Kim
(Continued)

FOREIGN PATENT DOCUMENTS

CN    101409305 A    4/2009
CN    106298851 A    1/2017
(Continued)

OTHER PUBLICATIONS

International Search Report of PCT/CN2019/098708 in Chinese, mailed Apr. 27, 2020.
(Continued)

*Primary Examiner* — Lauren R Bell
(74) *Attorney, Agent, or Firm* — Collard & Roe, P.C.; William Collard

(57) ABSTRACT

A display substrate and a display device. The display substrate includes a plurality of sub-pixel groups and a plurality of signal line groups. The plurality of signal line groups are arranged along a first direction and are spaced apart from each other, each of the signal line groups includes at least one signal line, and the signal line extends along a second direction intersecting the first direction. Each of the sub-pixel groups includes a first sub-pixel, and the first sub-pixel includes a first anode and a first effective light-emitting region, the first anode includes a first main portion, and the first main portion at least partially overlaps with the first effective light-emitting region, a size of the first main portion in the first direction is larger than a size of the first
(Continued)

main portion in the second direction, and the first anode overlaps with two adjacent signal line groups.

19 Claims, 8 Drawing Sheets

(51) Int. Cl.
 *H10K 59/124* (2023.01)
 *H10K 59/35* (2023.01)
 *H10K 59/80* (2023.01)
(52) U.S. Cl.
 CPC ......... *H10K 59/352* (2023.02); *H10K 59/353* (2023.02); *H10K 59/80515* (2023.02)

(56) References Cited

U.S. PATENT DOCUMENTS

| | | | |
|---|---|---|---|
| 10,461,268 B2 | 10/2019 | Jiang et al. | |
| 10,553,145 B2 | 2/2020 | Shi | |
| 10,811,489 B2 | 10/2020 | Hong et al. | |
| 10,854,683 B2 | 12/2020 | Lee | |
| 11,244,606 B2 | 2/2022 | Long | |
| 11,423,840 B2 | 8/2022 | Shang et al. | |
| 11,948,512 B2 | 4/2024 | Shang et al. | |
| 2010/0096988 A1* | 4/2010 | Kitabayashi | H01L 27/326 445/24 |
| 2011/0248965 A1 | 10/2011 | Suh | |
| 2014/0374703 A1 | 12/2014 | Jung | |
| 2015/0379924 A1 | 12/2015 | Matsueda et al. | |
| 2016/0133679 A1 | 5/2016 | Jeon et al. | |
| 2016/0260792 A1* | 9/2016 | Kim | H01L 27/3276 |
| 2016/0351116 A1 | 12/2016 | Sun | |
| 2017/0169760 A1* | 6/2017 | Kim | H01L 27/3218 |
| 2017/0330929 A1 | 11/2017 | Park | |
| 2018/0076270 A1 | 3/2018 | Kwon et al. | |
| 2018/0076272 A1* | 3/2018 | Koshihara | H01L 27/3265 |
| 2019/0011830 A1 | 1/2019 | Ji | |
| 2019/0207163 A1* | 7/2019 | Paek | H10K 59/122 |
| 2020/0152726 A1 | 5/2020 | Hong et al. | |
| 2021/0320166 A1 | 10/2021 | Zhao et al. | |
| 2021/0408203 A1 | 12/2021 | Shi et al. | |
| 2022/0123089 A1 | 4/2022 | Shang et al. | |
| 2022/0181402 A1 | 6/2022 | Huang et al. | |

FOREIGN PATENT DOCUMENTS

| | | | |
|---|---|---|---|
| CN | 106298865 A | 1/2017 | |
| CN | 107819010 A | 3/2018 | |
| CN | 108417608 A | 8/2018 | |
| CN | 207781607 U | 8/2018 | |
| CN | 108933155 A | 12/2018 | |
| CN | 109037194 A | 12/2018 | |
| CN | 208753327 U | 4/2019 | |
| CN | 109817672 A | 5/2019 | |
| CN | 110010058 A | 7/2019 | |
| CN | 110034132 A | 7/2019 | |
| EP | 3 407 389 A1 | 11/2018 | |
| JP | 2010-003880 A | 1/2010 | |
| JP | 2013-187187 A | 9/2013 | |
| JP | 2016-009636 A | 1/2016 | |
| KR | 10-2016-0148686 A | 12/2016 | |
| KR | 20170070437 A | 6/2017 | |
| KR | 10-2017-0129339 A | 11/2017 | |
| KR | 20180128545 A | 12/2018 | |
| RU | 2721754 C1 | 5/2020 | |
| RU | 2727938 C1 | 7/2020 | |
| TW | 201135703 A1 | 10/2011 | |
| TW | 201740560 A | 11/2017 | |
| WO | 2021018304 A1 | 2/2021 | |

OTHER PUBLICATIONS

Notice of Transmittal of the International Search Report of PCT/CN2019/098708 in Chinese, mailed Apr. 28, 2020.
Written Opinion of the International Searching Authority of PCT/CN2019/098708 in Chinese, mailed Apr. 27, 2020.
Taiwanese Office Action in Taiwanses Application No. 108142291, mailed Oct. 15, 2020 with English translation.
Indian Office Action in Indian Application No. 201947051441 dated Mar. 29, 2022 with English translation.
Chinese Office Action in Chinese Application No. 202080001429.6 dated Apr. 20, 2022 with English translation.
Korean Office Action in Application No. 10-2020-7037682 dated Sep. 14, 2022 with English translation.
Japanese Office Action dated Apr. 10, 2023 in Japanese Application No. 2019-569409, with English translation.
Mexican Office Action dated May 2, 2023 in Mexican Application No. MX/A/2019/015388; with English translation.
Korean Office Action in Korean Application No. 10-2020-7037682 dated Jul. 25, 2023 with English translation.
U.S. Office Action in U.S. Appl. No. 17/274,229, filed Sep. 10, 2024.
Third Chinese Office Action in Chinese Application No. 202080001429.6 dated Feb. 8, 2025 with English translation.

* cited by examiner

310

320

330

340

DISPLAY SUBSTRATE AND DISPLAY DEVICE

CROSS REFERENCE TO RELATED APPLICATIONS

This application is the National Stage of PCT/CN2019/098708 filed on Jul. 31, 2019, the disclosure of which is incorporated by reference.

TECHNICAL FIELD

Embodiments of the present disclosure relate to a display substrate and a display device.

BACKGROUND

With the continuous development of display technology, organic light-emitting diode (OLED) display panels have been increasingly applied to various electronic devices because of their advantages such as self-illumination, wide viewing angle, high contrast, low power consumption, high response speed, and so on.

With the increasing requirements for OLED display panels, in order to achieve the high-resolution design in small-sized display panels, the OLED display panels usually adopt an SPR pixel arrangement, that is, a pixel sharing method.

SUMMARY

At least one embodiment of the present disclosure provides a display substrate, which includes: a base substrate; a plurality of sub-pixel groups; and a plurality of signal line groups arranged along a first direction and spaced apart from each other. Each of the sub-pixel groups includes one first sub-pixel, and the first sub-pixel includes a first anode and a first effective light-emitting region, the first anode includes a first main portion, and the first main portion at least partially overlaps with the first effective light-emitting region, a size of the first main portion in the first direction is larger than a size of the first main portion in the second direction, and the first anode overlaps with two adjacent signal line groups.

For example, in the display substrate provided by an embodiment of the present disclosure, a ratio of the size of the first main portion in the first direction to the size of the first main portion in the second direction is $\gamma 1$, and a value of $\gamma 1$ ranges from 1.2 to 3.

For example, in the display substrate provided by an embodiment of the present disclosure, the signal line each includes a terminal connected to an external driving circuit.

For example, in the display substrate provided by an embodiment of the present disclosure, an orthographic projection of the first main portion on the base substrate is substantially in a strip shape, and an extending direction of the first main portion intersects the second direction.

For example, in the display substrate provided by an embodiment of the present disclosure, the extending direction of the first main portion is substantially perpendicular to the second direction.

For example, in the display substrate provided by an embodiment of the present disclosure, positions at which the two adjacent signal line groups overlapping with the first anode are located are at two ends of the first main portion in the first direction.

For example, in the display substrate provided by an embodiment of the present disclosure, the positions at which the two adjacent signal line groups overlapping with the first anode are located are substantially axisymmetric with respect to a first bisector of the first main portion, and the first bisector is parallel to the second direction.

For example, in the display substrate provided by an embodiment of the present disclosure, the first main portion is substantially in a hexagon shape or an ellipse shape, and a long symmetrical axis of the hexagon shape or a long axis of the ellipse shape is substantially parallel to the first direction.

For example, in the display substrate provided by an embodiment of the present disclosure, each of the signal line groups includes two signal lines, and the first anode overlaps with four signal lines of the two adjacent signal line groups.

For example, in the display substrate provided by an embodiment of the present disclosure, the at least one signal line in each of the signal line groups includes a first signal line and a second signal line, and a distance between the first signal line and the second signal line in one signal line group is less than a distance between the two adjacent signal line groups.

For example, in the display substrate provided by an embodiment of the present disclosure, in each of the signal line groups, the first signal line and the second signal line are sequentially arranged, and arrangement orders of the first signal line and the second signal in the two adjacent signal line groups are the same, and the two adjacent signal line groups include a first signal line group and a second signal line group arranged along the first direction, in the first signal line group, the first signal line is on a side of the second signal line away from the second signal line group, and in the second signal line group, the first signal line is on a side of the second signal line close to the first signal line group.

For example, in the display substrate provided by an embodiment of the present disclosure, the first signal line is a data line configured to transmit a data signal, and the second signal line is a power line configured to transmit a driving voltage.

For example, in the display substrate provided by an embodiment of the present disclosure, the first direction is perpendicular to the second direction.

For example, in the display substrate provided by an embodiment of the present disclosure, each of the sub-pixel groups further includes a second sub-pixel, the second sub-pixel includes a second anode, and the second anode overlaps with two adjacent signal line groups.

For example, in the display substrate provided by an embodiment of the present disclosure, orthographic projections of signal lines of the two adjacent signal line groups overlapping with the second anode on the base substrate extend along the second direction and pass through an orthographic projection of the second anode on the base substrate.

For example, in the display substrate provided by an embodiment of the present disclosure, the second sub-pixel includes a second effective light-emitting region, the second anode includes a second main portion, and the second main portion at least partially overlaps with the second effective light-emitting region, a size of the second main portion in the first direction is larger than a size of the second main portion in the second direction, positions at which the two adjacent signal line groups overlapping with the second anode are located are at two ends of the second main portion in the first direction.

For example, in the display substrate provided by an embodiment of the present disclosure, an orthographic projection of the second main portion on the base substrate is substantially in a strip shape, and an extending direction of the second main portion intersects the second direction.

For example, in the display substrate provided by an embodiment of the present disclosure, the extending direction of the second main portion is substantially perpendicular to the second direction.

For example, in the display substrate provided by an embodiment of the present disclosure, the positions at which the two adjacent signal line groups overlapping with the second anode are located are substantially axisymmetric with respect to a second bisector of the second main portion, and the second bisector is parallel to the second direction.

For example, in the display substrate provided by an embodiment of the present disclosure, the second main portion is substantially in a hexagon shape or an ellipse shape, and a long symmetrical axis of the hexagon shape or a long axis of the ellipse shape is substantially parallel to the first direction.

For example, in the display substrate provided by an embodiment of the present disclosure, each of the signal line groups includes two signal lines, and the second anode overlaps with four signal lines of the two adjacent signal line groups.

For example, in the display substrate provided by an embodiment of the present disclosure, each of the sub-pixel groups further includes a third sub-pixel pair, and the third sub-pixel pair each includes two third sub-pixels, each of the third sub-pixels includes a third anode, and two third anodes of the third sub-pixel pair each overlaps with one of the signal line groups, and two signal line groups respectively overlapping with the two third anodes of the third sub-pixel pair are adjacent to each other.

For example, in the display substrate provided by an embodiment of the present disclosure, orthographic projections of signal lines of the signal line group overlapping with the third anode on the base substrate extend along the second direction and pass through an orthographic projection of the third anode on the base substrate.

For example, in the display substrate provided by an embodiment of the present disclosure, the third sub-pixel includes a third effective light-emitting region, the third anode includes a third main portion, and the third main portion at least partially overlaps with the third effective light-emitting region, and the two signal line groups overlapping with the two third anodes of the third sub-pixel pair are substantially axisymmetric with respect to a third bisector of a line connecting centers of the two third main portions, and the third bisector is parallel to the second direction.

For example, in the display substrate provided by an embodiment of the present disclosure, each of the signal line groups includes two signal lines, and the two third anodes of the third sub-pixel pair each overlaps with two signal lines of one of the signal line groups, and the two signal line groups respectively overlapping with the two third anode of the third sub-pixel pair are adjacent to each other.

For example, in the display substrate provided by an embodiment of the present disclosure, the plurality of sub-pixel groups are arranged along the second direction to form a plurality of sub-pixel group columns, and are arranged along the first direction to form a plurality of sub-pixel group rows, and two adjacent sub-pixel group columns are misaligned by ½ pitch, and the pitch is equal to a distance between centers of two first sub-pixels of two adjacent sub-pixel groups in the second direction, in each of the sub-pixel groups, the first sub-pixel, the second sub-pixel, and the third sub-pixel pair are arranged along the second direction, and the two third sub-pixels of the third sub-pixel pair are arranged along the first direction.

For example, in the display substrate provided by an embodiment of the present disclosure, the first sub-pixel is configured to emit light of a first color, the second sub-pixel is configured to emit light of a second color, and the third sub-pixel is configured to emit light of a third color.

For example, in the display substrate provided by an embodiment of the present disclosure, the first color is blue, the second color is red, and the third color is green.

For example, the display substrate provided by an embodiment of the present disclosure further includes: a pixel defining layer, located on a side of the first anode away from the base substrate and including a first opening. The first sub-pixel further includes a first light-emitting layer, the first opening exposes the first anode, at least a portion of the first light-emitting layer is in the first opening and covers a portion of the first anode that is exposed, and a region defined by the first opening is the first effective light-emitting region of the first sub-pixel.

For example, the display substrate provided by an embodiment of the present disclosure further includes: a planarization layer, located between a film layer in which the plurality of signal line groups are located and a film layer in which the first anode is located. A height of each of the signal line groups in a direction perpendicular to the base substrate ranges from 650 nm to 850 nm, and a thickness of the planarization layer ranges from 1.4 µm to 1.6 µm.

For example, in the display substrate provided by an embodiment of the present disclosure, in a case where the sub-pixel group includes the second sub-pixel and the third sub-pixel, the pixel defining layer further includes a second opening and a third opening, the second sub-pixel further includes a second light-emitting layer, the second opening exposes the second anode, at least a portion of the second light-emitting layer is in the second opening and covers a portion of the second anode that is exposed, and a region defined by the second opening is a second effective light-emitting region of the second sub-pixel, the third sub-pixel further includes a third light-emitting layer, the third opening exposes the third anode, at least a portion of the third light-emitting layer is in the third opening and covers a portion of the third anode that is exposed, and a region defined by the third opening is a third effective light-emitting region of the third sub-pixel.

At least one embodiment of the present disclosure provides a display substrate, which includes: a base substrate; a plurality of sub-pixel groups; and a plurality of signal line groups arranged along a first direction and spaced apart from each other. Each of the signal line groups includes a first signal line and a second signal line, and the first signal line and the second signal line extend along a second direction intersecting the first direction. Each of the sub-pixel groups includes one first sub-pixel, and the first sub-pixel includes a first anode and a first effective light-emitting region, the first anode includes a first main portion, and the first main portion at least partially overlaps with the first effective light-emitting region, a size of an interval between two adjacent signal line groups in the first direction is 8-10 times of a size of the first signal line in the first direction, a size of the first main portion in the first direction is 15-17 times of the size of the first signal line in the first direction, and a size of the first main portion in the second direction is 9-11 times of the size of the first signal line in the first direction.

For example, in the display substrate provided by an embodiment of the present disclosure, a ratio of the size of the first main portion in the first direction to the size of the first main portion in the second direction is γ1, and a value of γ1 ranges from 1.5 to 1.7.

For example, in the display substrate provided by an embodiment of the present disclosure, each of the sub-pixel groups further includes a second sub-pixel, the second sub-pixel includes a second anode and a second effective light-emitting region, the second anode includes a second main portion, and the second main portion overlaps with the second effective light-emitting region, the size of an interval between two adjacent signal line groups in the first direction is 8-10 times of the size of the first signal line in the first direction, a size of the second main portion in the first direction is 12-14 times of the size of the first signal line in the first direction, and a size of the second main portion in the second direction is 4-6 times of the size the first signal line in the first direction.

For example, in the display substrate provided by an embodiment of the present disclosure, a ratio of the size of the second main portion in the first direction to the size of the second main portion in the second direction is γ2, and a value of γ2 ranges from 2.2 to 2.6.

For example, in the display substrate provided by an embodiment of the present disclosure, each of the sub-pixel groups further includes a third sub-pixel pair, each third sub-pixel pair includes two third sub-pixels, each third sub-pixel includes a third anode and a third effective light-emitting region, the third anode includes a third main portion, and the third main portion at least partially overlaps with the third effective light-emitting region, the size of an interval between two adjacent signal line groups in the first direction is 8-10 times of the size of the first signal line in the first direction, a size of the third main portion in the first direction is 6-8 times of the size of the first signal line in the first direction, and a size of the third main portion in the second direction is 7-9 times of the size of the first signal line in the first direction.

For example, in the display substrate provided by an embodiment of the present disclosure, a size of the second signal line in the first direction is 1.3-1.4 times of the size of the first signal line in the first direction.

For example, in the display substrate provided by an embodiment of the present disclosure, an orthographic projection of the first effective light-emitting region on the base substrate is within an orthographic projection of the first anode on the base substrate, and a shortest distance between an edge of the orthographic projection of the first effective light-emitting region on the base substrate and an edge of the orthographic projection of the first anode on the base substrate ranges from 1 to 3 microns.

For example, in the display substrate provided by an embodiment of the present disclosure, an orthographic projection of the second effective light-emitting region on the base substrate is within an orthographic projection of the second anode on the base substrate, and a shortest distance between an edge of the orthographic projection of the second effective light-emitting region on the base substrate and an edge of the orthographic projection of the second anode on the base substrate ranges from 1 to 3 microns.

For example, in the display substrate provided by an embodiment of the present disclosure, an orthographic projection of the third effective light-emitting region on the base substrate is within an orthographic projection of the third anode on the base substrate, and a shortest distance between an edge of the orthographic projection of the third effective light-emitting region on the base substrate and an edge of the orthographic projection of the third anode on the base substrate ranges from 1 to 3 microns.

For example, in the display substrate provided by an embodiment of the present disclosure, the first sub-pixel is a blue sub-pixel, the second sub-pixel is a red sub-pixel, and the third sub-pixel is a green sub-pixel.

At least one embodiment of the present disclosure provides a display substrate, which includes: a base substrate; a plurality of sub-pixel groups; and a plurality of signal line groups arranged along a first direction and spaced apart from each other. Each of the signal line groups includes a first signal line and a second signal line, and both the first signal line and the second signal line extend along a second direction intersecting the first direction, in each of the signal line groups, the first signal line and the second signal line are sequentially arranged, and arrangement orders of the first signal line and the second signal in two adjacent signal line groups are the same. Each of the sub-pixel groups includes a first sub-pixel, the first sub-pixel includes a first anode, and the first anode overlaps with two adjacent signal line groups.

For example, in the display substrate provided by an embodiment of the present disclosure, the two adjacent signal line groups include a first signal line group and a second signal line group arranged along the first direction, in the first signal line group, the first signal line is on a side of the second signal line away from the second signal line group, and in the second signal line group, the first signal line is on a side of the second signal line close to the first signal line group.

At least one embodiment of the present disclosure provides a display substrate, which includes: a base substrate; a plurality of signal line groups arranged along a first direction and spaced apart from each other, each of the signal line groups including a first signal line and a second signal line, and both the first signal line and the second signal line extending along a second direction intersecting the first direction, in each of the signal line groups, the first signal line and the second signal line being sequentially arranged, and arrangement orders of the first signal line and the second signal in two adjacent signal line groups being same; and a plurality of sub-pixel groups arranged along the second direction to form a plurality of sub-pixel group columns, and arranged along the first direction to form a plurality of sub-pixel group rows, and two adjacent sub-pixel group columns being misaligned by ½ pitch, and the pitch being equal to a distance between centers of two first sub-pixels of two adjacent sub-pixel groups in the second direction. Each of the sub-pixel groups includes a first sub-pixel, a second sub-pixel, and a third sub-pixel pair, and the third sub-pixel pair includes two third sub-pixels, and in each of the sub-pixel groups, the first sub-pixel, the second sub-pixel, and the third sub-pixel pair are arranged along the second direction, and the two third sub-pixels in the third sub-pixel pair are arranged along the first direction, the first sub-pixel includes a first anode, the second sub-pixel includes a second anode, and the third sub-pixel includes a third anode, the first anode overlaps with two adjacent signal line groups, the second anode overlaps with two adjacent signal line groups, and each of two third anodes of the third sub-pixel pair overlaps with one of the signal line groups, and two signal line groups respectively overlapping with the two third anode of the third sub-pixel pair are adjacent to each other.

At least one embodiment of the present disclosure provides a display device, which includes the above display substrate

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

Figure 1:
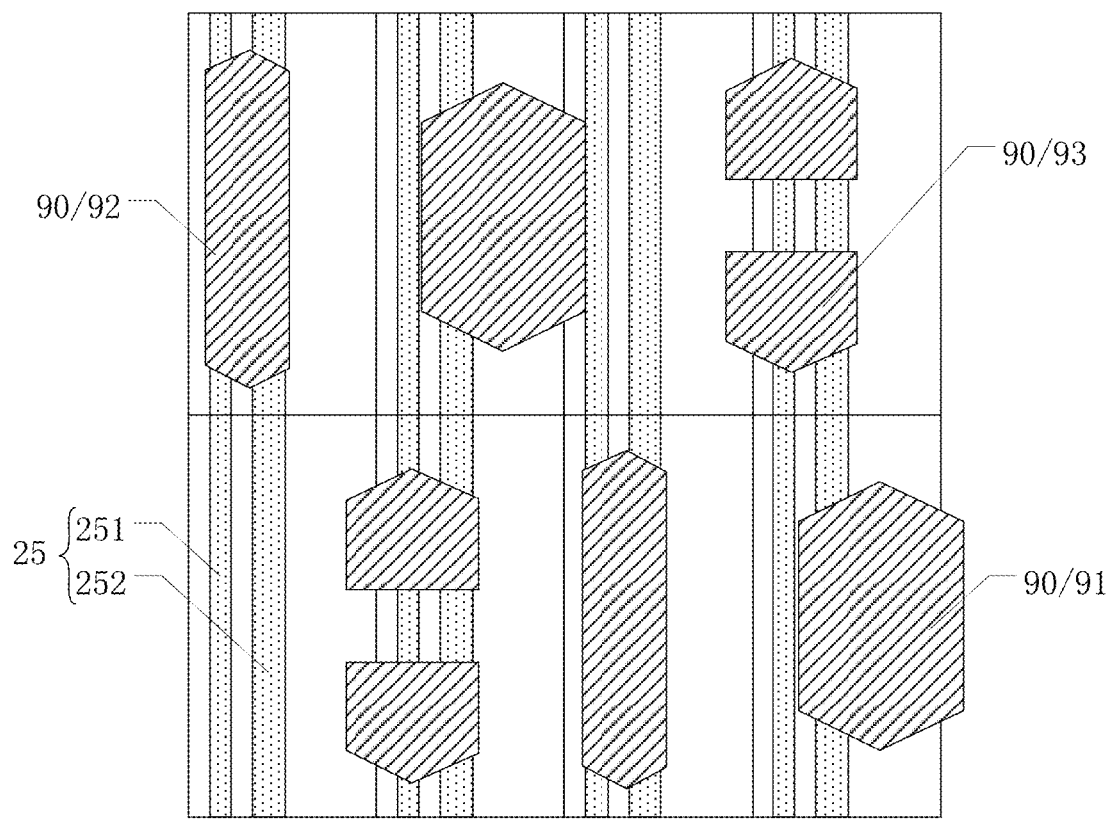
FIG. 1 is a schematic diagram of an OLED display substrate.

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art may obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "comprise/comprising," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may comprise an electrical connection/coupling, directly or indirectly.

A general OLED display substrate includes a base substrate, a driving circuit arranged on the base substrate, a planarization layer arranged on a side of the driving circuit away from the base substrate, an anode arranged on a side of the planarization layer away from the base substrate, a light-emitting layer arranged on a side of the anode away from the base substrate, and a cathode arranged on a side of the light-emitting layer away from the base substrate.

The driving circuit on the base substrate generally includes signal lines, such as a data line for transmitting or writing data and a power line (VDD line) for transmitting a driving voltage, made of a source-drain metal layer. Before preparing an anode on a side of a driving circuit away from the base substrate, it is needed to prepare a planarization layer (PLN) on the driving circuit, and then prepare the anode on the planarization layer, so that the subsequently prepared anode has a higher flatness. However, in order to achieve high resolution, the pixel size of the OLED display substrate is small, and the signal lines are relatively dense; in addition, in order to ensure the lifetime and display brightness of the OLED display substrate, the area of the effective light-emitting region of each pixel needs to be as large as possible. Therefore, the signal lines of the driving circuit are inevitably arranged under the anode, that is, the signal lines of the driving circuit overlap with the anode. In this case, because thicknesses of the signal lines made of the source-drain metal layer are large, the planarization layer on the signal lines made of the source-drain metal layer may not completely planarize the signal lines, thereby causing the anode on the planarization layer and the light-emitting layer on the anode to be uneven, and asymmetrical protrusions are generated on the anode and the light-emitting layer on the anode, which causes a color shift phenomenon generated when viewed from a left side and a right side of a normal line of the display substrate at the same angle with respect to the normal line of the display substrate.

Figure 2:
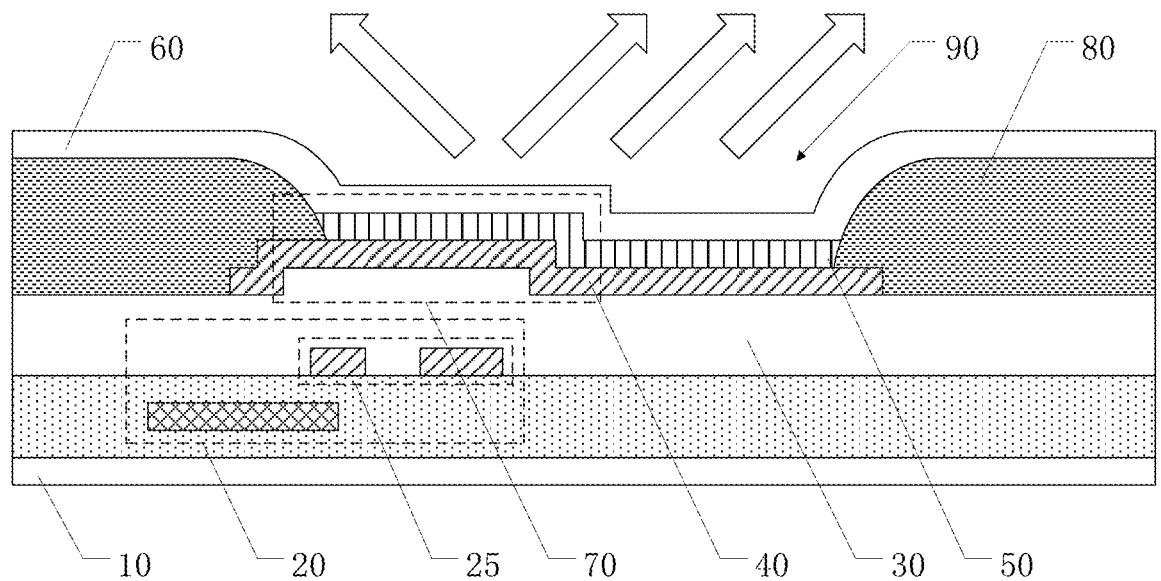
FIG. 2 is a cross-sectional diagram of a sub-pixel in an OLED display substrate.

FIG. 1 is a schematic diagram of an OLED display substrate. FIG. 2 is a cross-sectional diagram of a sub-pixel in an OLED display substrate. As shown in FIG. 1 and FIG. 2, the OLED display substrate includes: a base substrate 10, a pixel driving circuit 20, a planarization layer 30, an anode 40, a light-emitting layer 50, a cathode 60, and a pixel defining layer 80. The pixel defining layer 80 defines an effective light-emitting region 90, for example, a blue effective light-emitting region 91, a red effective light-emitting region 92, and a green effective light-emitting region 93. The driving circuit 20 includes a signal line group 25 made of a source-drain metal layer. FIG. 1 shows a position relationship of the signal line group 25 and the effective light-emitting region 90. As shown in FIG. 1, the signal line group 25 includes a data line 251 for transmitting or writing data and a power line 252 for transmitting a driving voltage. Because a size of the normal effective light-emitting region 90 in an extending direction of the data line 251 is larger than a size of the normal effective light-emitting region 90 in a direction perpendicular to the extending direction of the data line 251, the effective light-emitting region 90 generally covers only one signal line group 25. Moreover, as shown in FIG. 2, because a thickness of the signal line group 25 is large, the planarization layer 30 covering the signal line group 25 cannot completely planarize the display substrate, thereby causing the anode 40 on the planarization layer 30 and the light-emitting layer 50 on the anode 40 to be uneven, so that asymmetric protrusions 70 are generated on the anode 40 and on the light-emitting layer 50 on the anode 40. The asymmetric protrusions 70 are asymmetric with respect to a center of the effective light-emitting region 90 defined by the pixel defining layer 80, and light emitted by the asymmetric protrusions 70 to the left side and the right side of the normal line of the display substrate are different, thereby causing a color shift phenomenon when viewed from the left side and the right side of the normal line of the display substrate at the same angle with respect to the normal line of the display substrate. For example, the color of the display substrate being viewed from the left side of the normal line of the display substrate at an angle of 30 degrees from the normal line of the display substrate and the color of the display substrate being viewed from the right side of the normal line of the display substrate at an angle of 30 degrees from the normal line of the display substrate are different, thereby causing the above-described color shift phenomenon.

In this regard, embodiments of the present disclosure provide a display substrate and a display device. The display substrate includes a base substrate, a plurality of sub-pixel groups, and a plurality of signal line groups. The plurality of sub-pixel groups and the plurality of signal line groups are arranged on the base substrate; the plurality of signal line groups are arranged along a first direction and are spaced apart from each other, each of the signal line groups includes at least one signal line, and the signal line extends along a second direction intersecting the first direction. Each of the sub-pixel groups includes a first sub-pixel, the first sub-pixel includes a first anode, and the first anode overlaps with two adjacent signal line groups. Because the first anode overlaps with two adjacent signal line groups, even if the first anode forms two protrusions at positions where the first anode overlaps with the two adjacent signal line groups, the two protrusions can lower the asymmetry of the light emission of the first anode and the light-emitting layer on the first anode, and can even eliminate the asymmetry of the light emission of the first anode and the light-emitting layer on the first anode, thereby alleviating or even eliminating the view color shift phenomenon.

In the following, the display substrate and the display device provided by the embodiments of the present disclosure will be described in detail with reference to the accompanying drawings.

Figure 3:
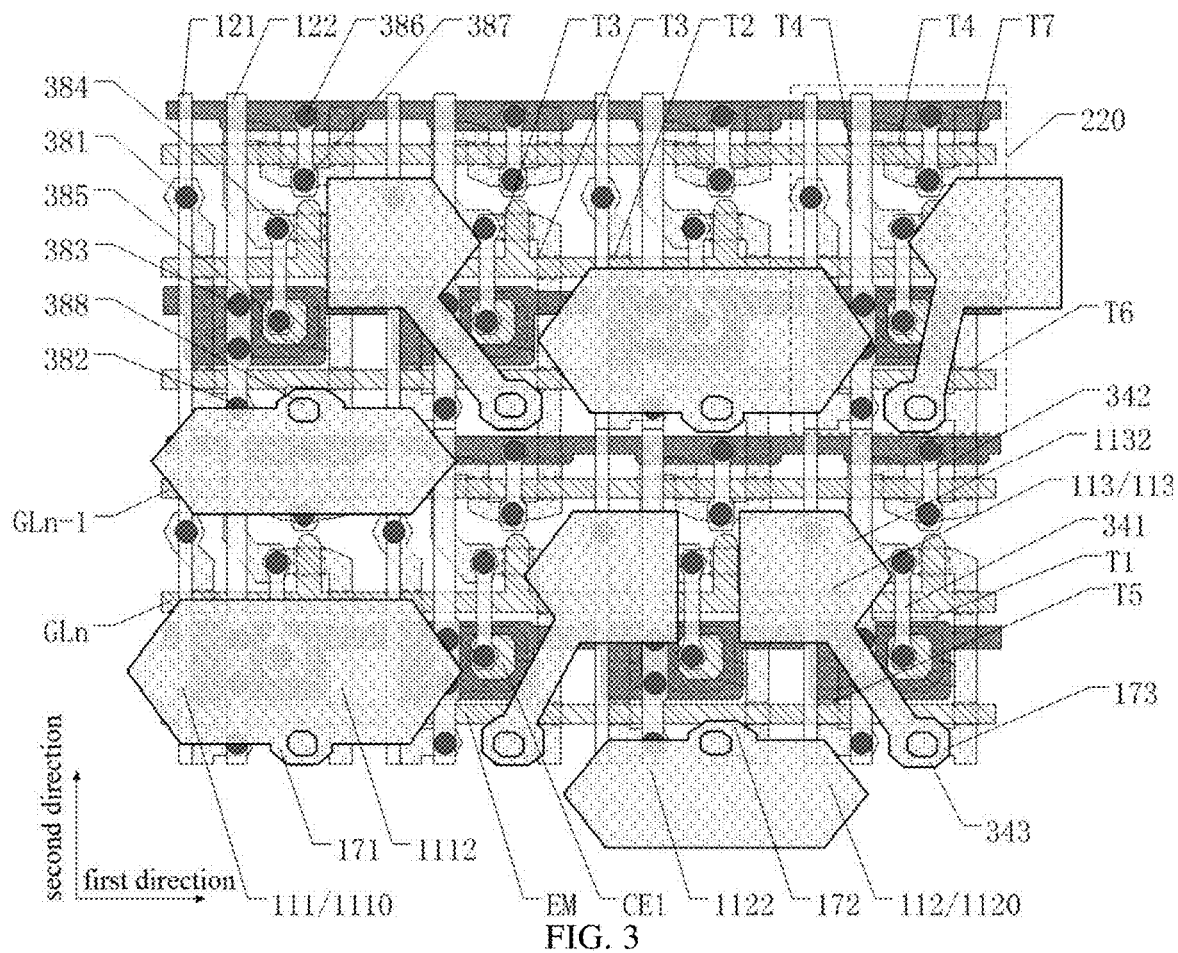
FIG. 3 is an arrangement diagram of a display substrate provided by an embodiment of the present disclosure.

FIG. 3 is an arrangement diagram of a display substrate provided by an embodiment of the present disclosure. As shown in FIG. 3, the display substrate includes a base substrate 101, a plurality of pixel driving circuits 220 on the base substrate 101, and a first sub-pixel 111, a second sub-pixel 112, and a third sub-pixel 113 that are on a side of the plurality of pixel driving circuits 220 away from the base substrate 101. A first anode 1110 of the first sub-pixel 111 may further include a first connection electrode 171 connected to a first main portion 1112; and the first connection electrode 171 is configured to connect the first main portion 1112 to a first sub-pixel driving circuit 220 corresponding to the first sub-pixel 111. Where the display substrate includes a second sub-pixel 112, as shown in FIG. 3, a second anode 1120 of the second sub-pixel 112 may further includes a second connection electrode 172 connected to a second main portion 1122; and the second connection electrode 172 is configured to connect the second main portion 1122 to a pixel driving circuit corresponding to the second sub-pixel 112. Where the display substrate includes a third sub-pixel 113, as shown in FIG. 3, a third anode 1130 of the third sub-pixel 113 may further includes a third connection electrode 173 connected to a third main portion 1132; and the third connection electrode 173 is configured to connect the third main portion 1132 to a pixel driving circuit corresponding to the third sub-pixel 113.

For example, in some examples, as shown in FIG. 3, the first connection electrode 171 may be a protrusion located at an intermediate portion of an edge of the first main portion 1112 away from the second main portion 1122; the second connection electrode 172 may be a protrusion located at an intermediate portion of an edge of the second main portion 1122 away from the first main portion 1112; the third connecting electrode 173 may be an extending portion extending outward from the third main portion 1132; and two third connection electrodes 173 of two third main portions 1132 of a third sub-pixel pair 116 respectively extend toward two ends of the second main portion 1122 in the first direction, and are spaced apart from the second main portion 1122.

Figure 4:
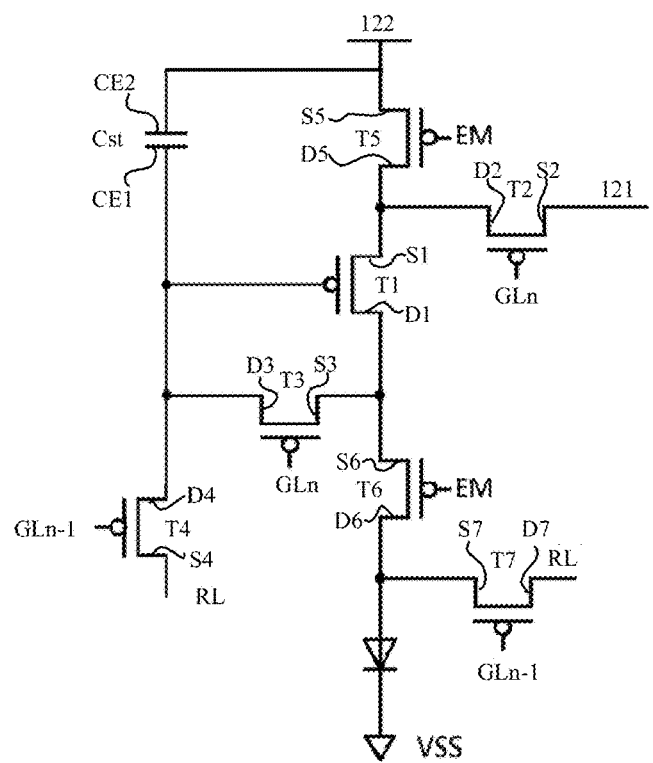
FIG. 4 is an equivalent circuit diagram of a pixel driving circuit of a sub-pixel in a display substrate provided by an embodiment of the present disclosure.

For example, as shown in FIG. 3, the plurality of pixel driving circuits 220 are used to drive the first sub-pixel 111, the second sub-pixel 112, and the third sub-pixel 113. FIG. 4 is an equivalent circuit diagram of a pixel driving circuit of a sub-pixel in a display substrate provided by an embodiment of the present disclosure. The pixel driving circuit shown in FIG. 4 may be used for any one of the first sub-pixel 111, the second sub-pixel 112, and the third sub-pixel 113. As shown in FIG. 4, the pixel driving circuit 220 includes a plurality of thin film transistors T1, T2, T3, T4, T5, T6, and T7, and a plurality of signal lines connected to the plurality of thin film transistors T1, T2, T3, T4, T5, T6, and T7. The plurality of signal lines include a gate line GL, an emission control line EM, an initialization line RL, a data line 121, a power line 122, and a capacitor Cst. The gate line GL is used for transmitting a gate signal, and may include a first gate line GLn and a second gate line GLn-1; the emission control line EM can transmit a control signal. Therefore, the pixel driving circuit is a 7T1C pixel driving circuit. Of course, the embodiments of the present disclosure include but are not limited thereto, and the first sub-pixel, the second sub-pixel, and the third sub-pixel may also adopt other types of pixel driving circuits.

For example, as shown in FIG. 4, a first gate electrode G1 of the first thin film transistor T1 is connected to a third drain electrode D3 of the third thin film transistor T3 and a fourth drain electrode D4 of the fourth thin film transistor T4. A first source electrode S1 of the first thin film transistor T1 is connected to a second drain electrode D2 of the second thin film transistor T2 and a fifth drain electrode D5 of the fifth thin film transistor T5. A first drain electrode D1 of the first thin film transistor T1 is connected to a third source electrode S3 of the third thin film transistor T3 and a sixth source electrode S6 of the sixth thin film transistor T6.

For example, as shown in FIG. 4, a second gate electrode G2 of the second thin film transistor T2 is connected to the first gate line GLn, a second source electrode S2 of the second thin film transistor T2 is connected to the data line 121, and a second drain electrode D2 of the second thin film transistor T2 is connected to the first source electrode S1 of the first thin film transistor T1.

For example, as shown in FIG. 4, a third gate electrode G3 of the third thin film transistor T3 is connected to the first gate line GLn, a third source electrode S3 of the third thin film transistor T3 is connected to the first drain electrode D1 of the first thin film transistor T1, and a third drain electrode D3 of the third thin film transistor T3 is connected to the first gate electrode G1 of the first thin film transistor T1.

For example, as shown in FIG. 4, a fourth gate electrode G4 of the fourth thin film transistor T4 is connected to the second gate line GLn-1, a fourth source electrode S4 of the fourth thin film transistor T4 is connected to the initialization line RL, a fourth drain electrode D4 of the fourth thin film transistor T4 is connected to the first gate electrode G1 of the first thin film transistor T1, and an initialization voltage Vint is applied through the initialization line RL.

For example, as shown in FIG. 4, a fifth gate electrode G5 of the fifth thin film transistor T5 is connected to the emission control line EM, a fifth source electrode S5 of the fifth thin film transistor T5 is connected to the power line 122, and a fifth drain electrode D5 of the fifth thin film transistor T5 is connected to the first source electrode S1 of the first thin film transistor T1.

For example, as shown in FIG. 4, a sixth gate electrode G6 of the sixth thin film transistor T6 is connected to the emission control line EM, a sixth source electrode S6 of the sixth thin film transistor T6 is connected to the first drain electrode D1 of the first thin film transistor T1, and a sixth drain electrode D6 of the sixth thin film transistor T6 is connected to the anode of each sub-pixel (for example, the first anode, the second anode, or the third anode described above).

For example, as shown in FIG. 4, a seventh gate electrode G7 of the seventh thin film transistor T7 is connected to the second gate line GLn-1, and a seventh source electrode S7 of the seventh thin film transistor T7 is connected to the anode of each sub-pixel, and a seventh drain electrode D7 of the seventh thin film transistor T7 is connected to the fourth source electrode S4 of the fourth thin film transistor T4.

For example, as shown in FIG. 4, the capacitor CSt includes a first electrode CE1 and a second electrode CE2, the second electrode CE2 is connected to the power line 122, and the first electrode CE1 is connected to the first gate electrode G1 of the first thin film transistor T1 and the third drain electrode D3 of the third thin film transistor T3.

An operation mode of the pixel driving circuit shown in FIG. 4 will be illustratively described below. First, where a reset signal is transmitted to the second gate line GLn-1 and the seventh thin film transistor T7 is allowed to be turned on, the residual current flowing through the anode of each sub-pixel is discharged to the fourth thin film transistor T4 through the seventh thin film transistor T7, thereby light emission caused by the residual current flowing through the anode of each sub-pixel can be suppressed. Then, where the initialization signal is transmitted to the second gate line GLn-1 and the initialization voltage Vint is transmitted to the initialization line RL, the fourth thin film transistor T4 is turned on, and the initialization voltage Vint is applied to the first gate electrode G1 of the first thin film transistor T1 and the first electrode CE2 of the capacitor Cst through the fourth thin film transistor T4, so that the first gate electrode G1 and the capacitor Cst are initialized. The initialization of the first gate electrode G1 can allow the first thin film transistor T1 to be turned on. It should be noted that the above reset signal and the above initialization signal may be the same signal.

Subsequently, where a gate signal is transmitted to the first gate line GLn and a data signal is transmitted to the data line 121, both the second thin film transistor T2 and the third thin film transistor T3 are turned on, and a data voltage Vd is applied to the first gate electrode G1 through the second thin film transistor T2, the first thin film transistor T1, and the third thin film transistor T3. In this case, the voltage applied to the first gate electrode G1 is a compensation voltage Vd+Vth, and the compensation voltage applied to the first gate electrode G1 is also applied to the first electrode CE1 of the capacitor Cst.

Subsequently, the power line 122 applies a driving voltage Ve1 to the second electrode CE2 of the capacitor Cst, and applies a compensation voltage Vd+Vth to the first electrode CE1, so that electric charges corresponding to the difference between the voltages respectively applied to the two electrodes of the capacitor Cst are stored in the capacitor Cst, and the first thin film transistor T1 is turned on for predetermined time.

Subsequently, where an emission control signal is applied to the emission control line EM, both the fifth thin film transistor T5 and the sixth thin film transistor T6 are turned on, so that the fifth thin film transistor T5 applies the driving voltage Ve1 to the first thin film transistor T1. Where the driving voltage Ve1 are transmitted through the first thin film transistor T1 that is turned on by the capacitor Cst, the difference between the corresponding driving voltage Ve1 and the voltage applied to the first gate electrode G1 through the capacitor Cst drives the current Id to flow through the first drain electrode D1 of the first thin film transistor T1, and the driving current Id is applied to each sub-pixel through the sixth thin film transistor T6, so that the light-emitting layer of each sub-pixel emits light.

Figure 5A:
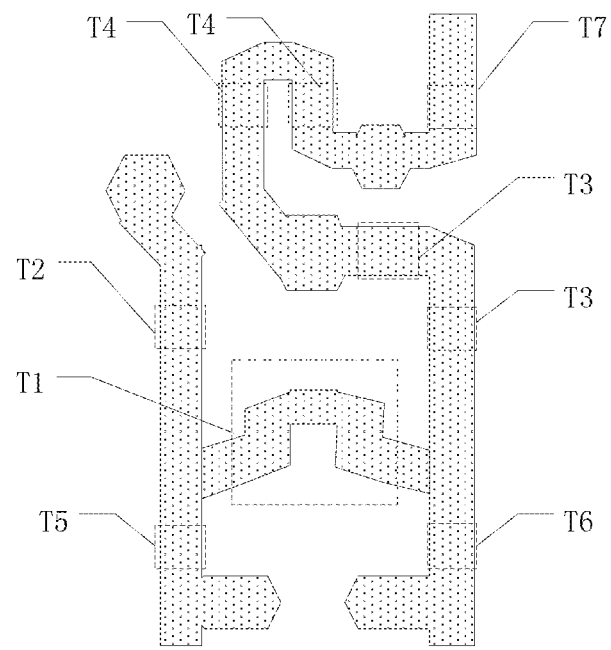
FIGS. 5A-5E are schematic diagrams of each layer of a pixel driving circuit in a display substrate provided by an embodiment of the present disclosure.
Figure 5B:
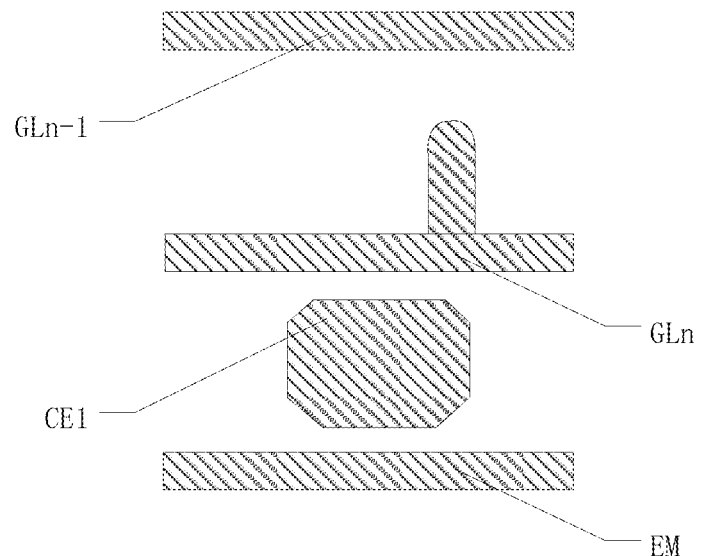
Figure 5C:
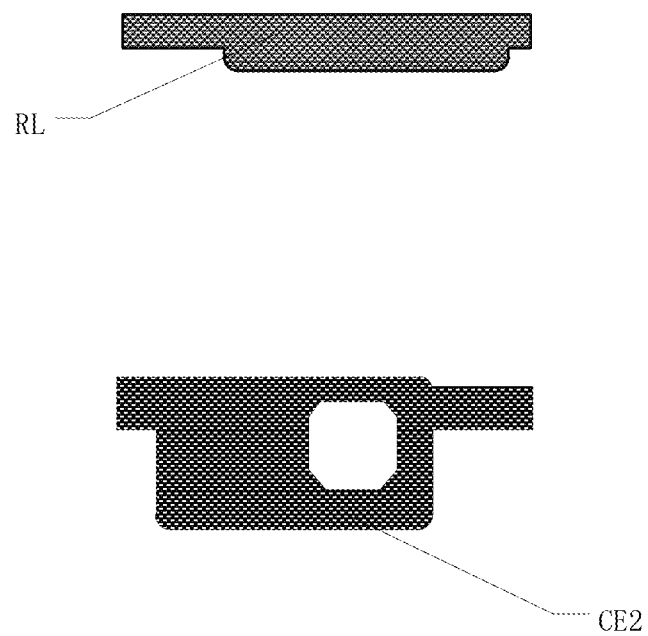
Figure 5D:
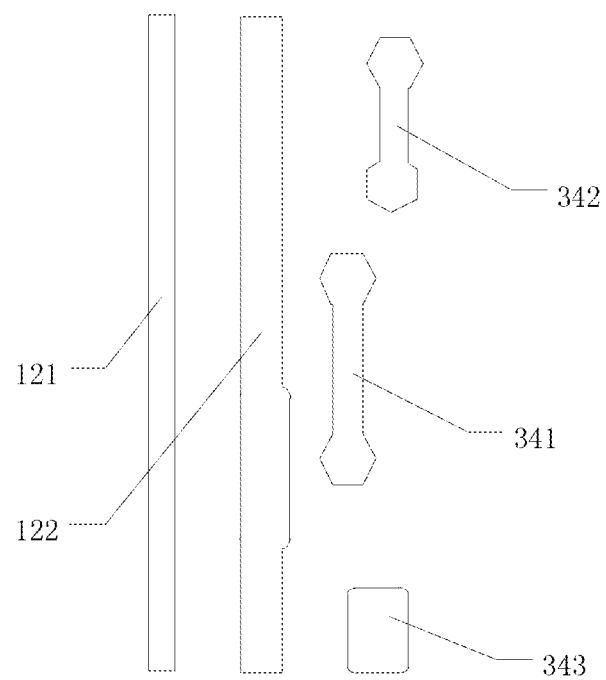
Figure 5E:
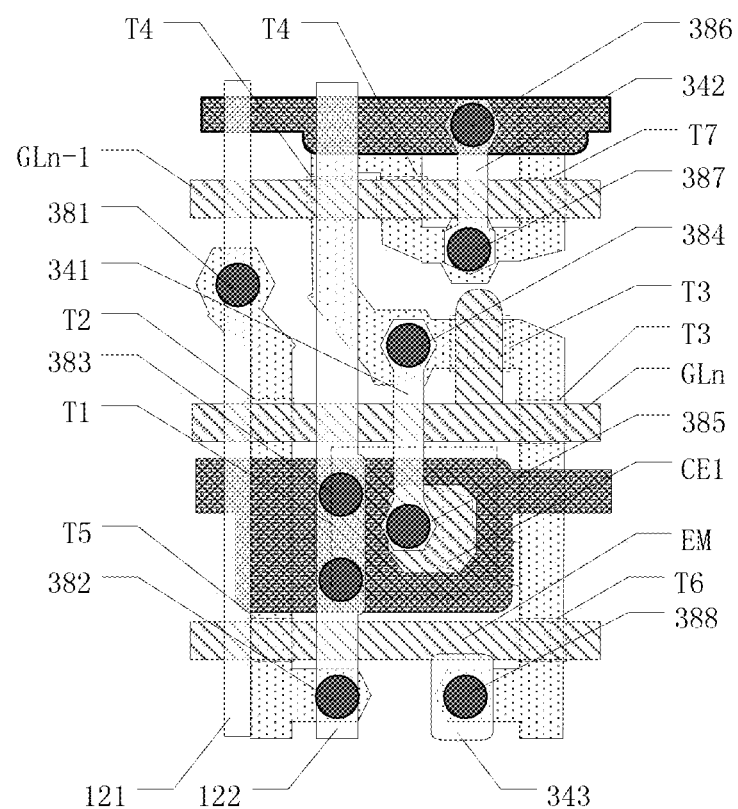

FIGS. 5I-5E are schematic diagrams of each layer of a pixel driving circuit in a display substrate provided by an embodiment of the present disclosure. The pixel driving circuit 220 includes the above thin film transistors T1, T2, T3, T4, T5, T6, and T7, the gate lines GLn, GLn-1, the emission control line EM, the initialization line RL, the data line 121, the power line 122, and capacitor Cst that are connected to the thin film transistors T1, T2, T3, T4, T5, T6, and T7. In the following, the structure of the pixel driving circuit 220 will be described with reference to FIGS. 5A-5E.

For example, FIG. 5A shows a semiconductor layer 310 of the pixel driving circuit 220. The semiconductor layer 310 may be formed by patterning using a semiconductor material. The semiconductor layer 310 can be used to prepare active layers of the thin film transistors T1, T2, T3, T4, T5, T6, and T7 described above, and each active layer may include a source region, a drain region, and a channel region between the source region and the drain region. For example, the semiconductor layer 310 may be made of amorphous silicon, polycrystalline silicon, an oxide semiconductor material, or the like. It should be noted that the source region and the drain region described above may be regions doped with an n-type impurity or a p-type impurity.

In the display substrate provided by the embodiments of the present disclosure, a gate insulating layer (not shown) is formed on the above semiconductor layer for protecting the above semiconductor layer. FIG. 5B shows a first conductive layer 320 of the pixel driving circuit 220. The first conductive layer 320 is arranged on the gate insulating layer, and therefore is insulated from the semiconductor layer 310. The first conductive layer 320 may include the first electrode CE1 of the capacitor Cst, the gate lines GLn, GLn-1, the emission control line EM, and the gate electrodes of the thin film transistors T1, T2, T3, T4, T5, T6, and T7 (for example, the first gate electrode G1, the second gate electrode G2, the third gate electrode G3, the fourth gate electrode G4, the fifth gate electrode G5, the sixth gate electrode G6, and the seventh gate electrode G7 described above.) As shown in FIG. 5B, the gate electrodes of the thin film transistors T2, T4, T5, T6, and T7 are portions of the gate lines GLn, GLn-1 that overlap with the semiconductor layer 310, and the thin film transistor T3 may be a double-gate structure thin film transistor, one gate electrode of the thin film transistor T3 may be a portion of the gate line GLn that overlaps with the semiconductor layer 310, and the other gate electrode of the thin film transistor T3 may be a protrusion protruding from the gate line GLn; and the gate electrode of the thin film transistor T1 may be the first electrode CE1.

In the display substrate provided by the embodiments of the present disclosure, an insulating layer (not shown) is formed on the first conductive layer to protect the first conductive layer. FIG. 5C shows a second conductive layer 330 of the pixel driving circuit 220, and the second conductive layer 330 includes the second electrode CE2 of the capacitor Cst and the initialization line RL. The second electrode CE2 at least partially overlaps with the first electrode CE1 to form the capacitor Cst.

In the display substrate provided by the embodiments of the present disclosure, a first protective layer (not shown) is formed on the second conductive layer to protect the second conductive layer. FIG. 5D shows a third conductive layer 340 of the pixel driving circuit 220, and the third conductive layer 340 includes the data line 121 and the power line 122. FIG. 5E is a schematic diagram of a stacked position relationship of the semiconductor layer 310, the first conductive layer 320, the second conductive layer 330, and the third conductive layer 340 described above. As shown in FIGS. 5D and 5E, the data line 121 is connected to the source region of the thin film transistor T2 in the semiconductor layer 310 through at least one via hole (for example, a first via hole 381) in the gate insulating layer, the insulating layer, and the first protective layer. The power line 122 is connected to the source region corresponding to the thin film transistor T5 in the semiconductor layer 310 through at least one via hole (for example, a second via hole 382) in the gate insulating layer, the insulating layer, and the first protective layer. The power line 122 is connected to the second electrode CE2 of the second conductive layer 330 through at least one via hole (for example, two third via holes 383) in the first protective layer. The third conductive layer 340 further includes a first connection portion 341, a second connection portion 342, and a third connection portion 343. One end of the first connection portion 341 is connected to the drain region corresponding to the third thin film transistor T3 in the semiconductor layer 310 through at least one via hole (for example, a fourth via hole 384) in the gate insulating layer, the insulating layer, and the first protective layer. The other end of the first connection portion 341 is connected to the gate electrode of the first thin film transistor T1 in the first conductive layer 320 through at least one via hole (for example, a fifth via hole 385) in the insulating layer and the first protective layer. One end of the second connection portion 342 is connected to the initializing line RL through one via hole (for example, a sixth via hole 386) in the first protective layer, and the other end of the second connection portion 342 is connected to the drain region of the seventh thin film transistor T7 in the semiconductor layer 310 through at least one via hole (for example, a seventh via hole 387) in the gate insulating layer, the insulating layer, and the first protective layer. The third connection portion 343 is connected to the drain region of the sixth thin film transistor T6 in the semiconductor layer 310 through at least one via hole (for example, an eighth via hole 388) in the gate insulating layer, the insulating layer, and the first protective layer.

In the display substrate provided by the embodiments of the present disclosure, a second protective layer (not shown) is formed on the third conductive layer to protect the third conductive layer. The anode of each sub-pixel may be arranged on the second protective layer.

Figure 6:
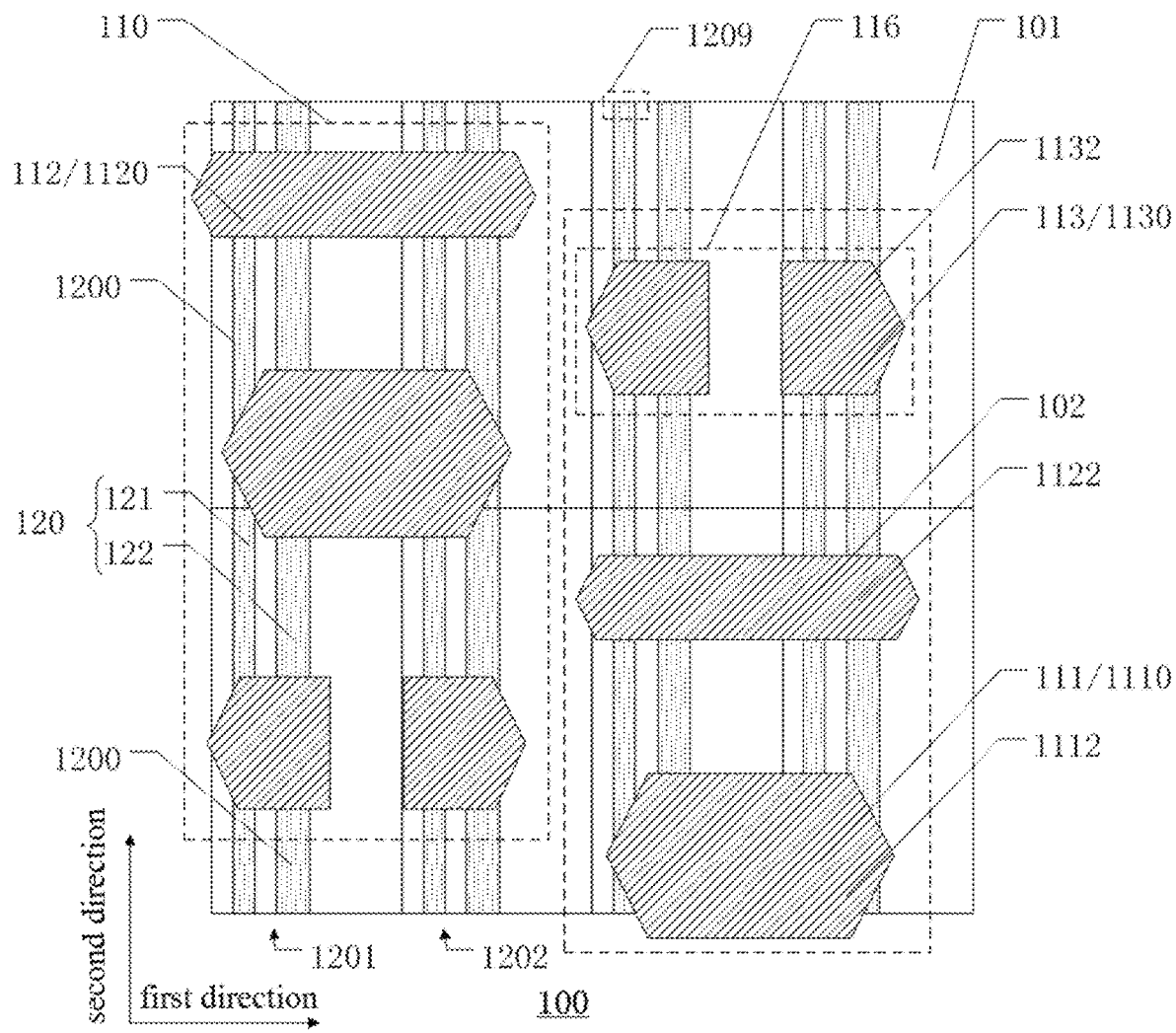
FIG. 6 is a plane schematic diagram of a display substrate provided by an embodiment of the present disclosure.

An embodiment of the present disclosure provides a display substrate. FIG. 6 is a plane schematic diagram of a display substrate provided by an embodiment of the present disclosure. As shown in FIG. 6, the display substrate 100 includes a base substrate 101, a plurality of sub-pixel groups 110, and a plurality of signal line groups 120. The plurality of sub-pixel groups 110 and the plurality of signal line groups 120 are arranged on the base substrate 101; the plurality of signal line groups 120 are arranged along the first direction and are spaced apart from each other. Each of signal line groups 120 includes at least one signal line 1200, the signal lines 1200 extends along a second direction intersecting the first direction. Each of the sub-pixel groups 110 includes a first sub-pixel 111, the first sub-pixel 111 includes a first anode 1110; and the first anode 1110 overlaps with two adjacent signal line groups 120. That is, an orthographic projection of the first anode 1110 on a plane in which the signal line groups 120 are located overlaps with the two adjacent signal line groups 120. It should be noted that, in the display field, a pixel generally includes a plurality of sub-pixels that can respectively display a single color (for example, red, green, or blue), and a ratio of sub-pixels of different colors are controlled, so as to display different colors, the first sub-pixel described above is a monochrome sub-pixel; in addition, the signal line group described above refers to a set of at least a part of signal lines shared by driving circuits of a same column of sub-pixels.

For example, as shown in FIG. 6, the first sub-pixel 111 includes a first effective light-emitting region 1115, the first anode 1110 includes a first main portion 1112, and the first main portion 1112 at least partially overlaps with the first effective light-emitting region 1115. A size of the first main portion 1112 in the first direction is larger than a size of the first main portion 1112 in the second direction, and the first anode 1110 overlapping with the two adjacent signal line groups 120 may be the first main portion 1112 overlapping with the two adjacent signal line groups 120. In the display substrate provided by the embodiments of the present disclosure, because the first anode overlaps with two adjacent signal line groups, the first anode forms two protrusions at positions where the first anode overlaps with the two adjacent signal line groups. The two protrusions can reduce the asymmetry of the light emission of the first anode and the light-emitting layer on the first anode, and even can eliminate the asymmetry of the light emission of the first anode and the light-emitting layer on the first anode, thereby alleviating and even eliminating the color shift phenomenon generated when viewed from the left side and the right side of the normal line of the display substrate at the same angle with respect to the normal line of the display substrate. It should be noted that the left side and right side of the normal line of the display substrate described above may be two sides of the extending direction of the signal line groups.

For example, as shown in FIG. 6, the signal line group may be composed of the data line 121 and the power line 122, and the first anode 1110 of the first sub-pixel 111 overlaps with two adjacent signal line groups.

Figure 7:
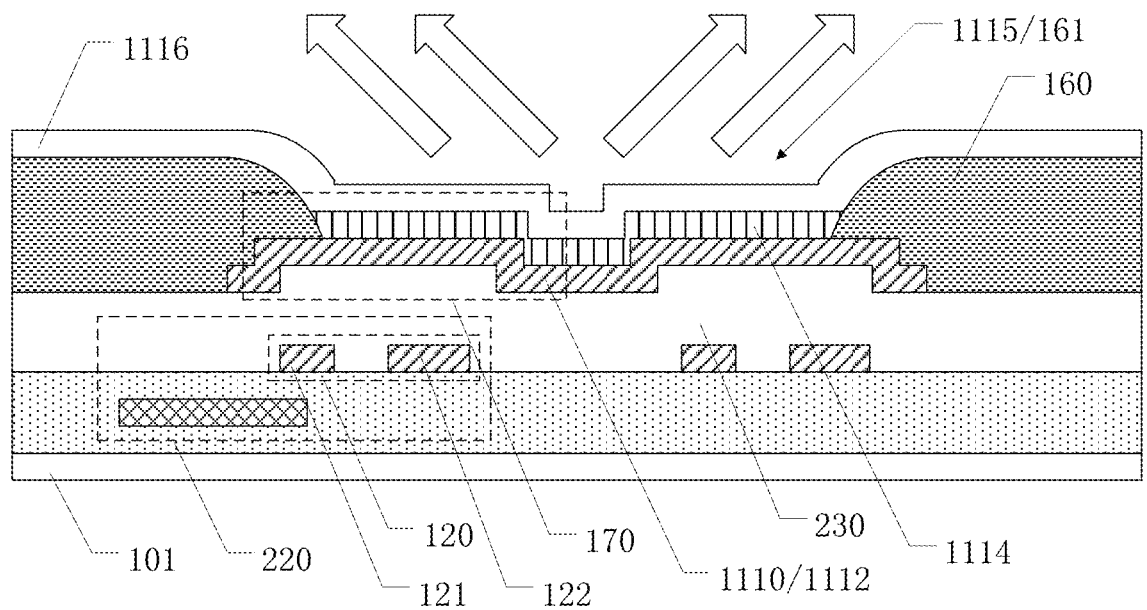
FIG. 7 is a structural schematic diagram of a display substrate provided by an embodiment of the present disclosure.

FIG. 7 is a structural schematic diagram of another display substrate provided by an embodiment of the present disclosure. As shown in FIG. 7, because the first anode 1110 overlaps with the two adjacent signal line groups 120, the first anode 1110 forms two protrusions 170 at positions where the first anode 1110 overlaps with the two adjacent signal line groups 120. It can be seen that, compared with only one protrusion, the two protrusions 170 can reduce the asymmetry of the light emission of the first anode 1110 and the light-emitting layer on the first anode 1110, and even can eliminate the asymmetry of the light emission of the first anode 1110 and the light-emitting layer on the first anode 1110, thereby alleviating or even eliminating the color shift phenomenon generated when viewed from the left side and the right side of the normal line of the display substrate at the same angle with respect to the normal line of the display substrate.

For example, in some examples, a ratio of the size of the first main portion 1112 in the first direction to the size of the first main portion 1112 in the second direction is γ1, and a value of γ1 ranges from 1.2 to 3. For example, in some examples, as shown in FIG. 6, orthographic projections of signal lines 1200 in the two signal line groups 120 overlapping with the first anode 1110 on the base substrate 101 extend along the second direction and pass through an orthographic projection of the first anode 1110 on the base substrate 101. That is, the signal lines of the two signal line groups overlapping with the first anode extends through the first anode, so that the protrusions formed by the first anode also pass through the first anode along the second direction.

For example, in some examples, as shown in FIG. 6, each signal line 1200 may extend beyond the display region of the display substrate, in addition, each signal line 1200 may include a terminal 1209 that is connected to an external driving circuit. For example, where the signal line is a data line, the signal line may include a terminal connected to a data driver.

For example, in some examples, the base substrate 101 may be a transparent substrate; for example, the base substrate 101 may be a glass substrate, a plastic substrate, a quartz substrate, or the like. Of course, the embodiments of the present disclosure include but are not limited thereto, and the material of the base substrate 101 can be selected according to actual conditions and needs.

For example, in some examples, as shown in FIGS. 6 and 7, the first sub-pixel 111 includes a first effective light-emitting region 1115, the first anode 1110 includes a first main portion 1112, and the first main portion 1112 at least partially overlaps with the first effective light-emitting region 1115. A size of the first main portion 1112 in the first direction is larger than a size of the first main portion 1112 in the second direction, and positions at which the two adjacent signal line groups 120 overlapping with the first anode 1110 are located are at two ends of the first main portion 1112 in the first direction. In this case, because the positions at which the two adjacent signal line groups 120 overlapping with the first anode 1110 are located are at two ends of the first main portion 1112 in the first direction without passing through the center of the first main portion 1112, the symmetry of the two protrusions 170 formed at the positions where the first anode 1110 overlaps with the two adjacent signal line groups 120 is higher, so that the color shift phenomenon when viewed from the left side and the right side of the normal line of the display substrate at the same angle with respect to the normal line of the display substrate can be alleviated or even eliminated. It should be noted that the first anode shown in FIG. 6 only shows the first main portion.

For example, in some examples, as shown in FIGS. 6 and 7, an orthographic projection of the first main portion 1112 on the base substrate 101 is substantially in a strip shape, and an extending direction of the first main portion 1112 intersects the second direction.

For example, in some examples, as shown in FIGS. 6 and 7, the extending direction of the first main portion 1112 is substantially perpendicular to the second direction. It should be noted that the above "substantially perpendicular" means that an angle between the extending direction of the first main portion and the second direction ranges from 85 to 90 degrees.

For example, in some examples, as shown in FIGS. 6 and 7, the positions at which the two adjacent signal line groups 120 overlapping with the first anode 1110 are located are substantially axisymmetric with respect to a first bisector of the first main portion 1112, and the first bisector is parallel to the second direction. In this case, as shown in FIG. 7, the first anode 1110 forms two protrusions 170 at the positions where the first anode 1110 overlaps with the two adjacent signal line groups 120, and the two protrusions 170 can further effectively reduce the asymmetry of the light emission of the first anode and the light-emitting layer on the first anode, and even eliminating the asymmetry of the light emission of the first anode and the light-emitting layer on the first anode, thereby alleviating or even eliminating the color shift phenomenon generated when viewed from the left side and the right side of the normal line of the display substrate at the same angle with respect to the normal line of the display substrate.

It should be noted that, because the signal line group includes at least one signal line, that is, the case that the signal line group includes a plurality of signal lines exists, the positions at which the two adjacent signal line groups are located being substantially axisymmetric with respect to the first bisector of the first main portion 1112 refers to the positions at which the two adjacent signal line groups are located instead of the two signal line groups themselves being substantially axisymmetric with respect to the first bisector of the first main portion. In addition, the positions at which the two adjacent signal line groups are located may be geometric centers of the signal line groups, for example, geometric centers of orthographic projections of the signal line groups on the first main portion.

For example, in some examples, as shown in FIG. 6, in each signal line group 1200, the first signal line 121 and the second signal line 122 are sequentially arranged, and arrangement orders of the first signal line 121 and the second signal line 122 in the two adjacent signal line groups 120 are the same. Therefore, the positions at which the two adjacent signal line groups are located being substantially axisymmetric with respect to the first bisector of the first main portion 1112 refers to the positions at which the two adjacent signal line groups are located instead of the two signal line groups themselves being substantially axisymmetric with respect to the first bisector of the first main portion.

For example, in some examples, as shown in FIG. 6, the two adjacent signal line groups 120 include a first signal line group 1201 and a second signal line group 1202 arranged along the first direction, in the first signal line group 1201, the first signal line 121 is located on a side of the second signal line 122 away from the second signal line group 1202, and in the second signal line group 1202, the first signal line 121 is located on a side of the second signal line 122 close to the first signal line group 1201.

For example, in some examples, as shown in FIG. 6, the size of the first main portion 1112 in the first direction is larger than the size of the first main portion 1112 in the second direction. That is, the shape of the first main portion 1112 is a long strip shape, such as a hexagon shape or an ellipse shape. As shown in FIG. 1, because a size of a normal anode in the second direction is larger than a size of the normal anode in the first direction, the normal anode generally covers only one signal line group. The size of the first main portion of the first anode provided by the embodiments of the present disclosure in the first direction is larger than the size of the first main portion 1112 in the second direction, so that the first anode can overlap with two adjacent signal line groups under the same area. For example, the first main portion 1112 provided by the embodiments of the present disclosure may be obtained by rotating the main portion of the corresponding anode in the display substrate shown in FIG. 1 by 90 degrees.

For example, the size of the first main portion 1112 in the first direction ranges from 45 to 60 microns; and the size of the first main portion 1112 in the second direction ranges from 15 to 30 microns. It should be noted that the above sizes are only illustrative examples, and the size of the first main portion in the embodiments of the present disclosure may be determined according to the size and resolution of the actual product.

For example, in some examples, as shown in FIG. 6, the first main portion 1112 is substantially in a hexagon shape or an ellipse shape, and a long symmetrical axis of the hexagon shape or a long axis of the ellipse shape is substantially parallel to the first direction. It should be noted that the above-mentioned "substantially parallel" means that an angle between the long symmetrical axis of the hexagon shape or the long axis of the ellipse shape and the first direction does not exceed 5 degrees.

It should be noted that the embodiments of the present disclosure include but are not limited thereto, and the shape of the first main portion in the embodiments of the present disclosure may also be other long strip shapes; in addition, where the first main portion is substantially in the hexagon shape or the ellipse shape, the long symmetrical axis of the hexagon shape or the long axis of the ellipse shape may not be parallel to the first direction, as long as the orthographic projection of the first anode on the plane in which the signal line groups are located overlaps with the two adjacent signal line groups.

For example, in some examples, as shown in FIG. 7, the display substrate further includes a pixel defining layer 160 on a side of the first anode 1110 away from the base substrate 101 and including a first opening 161. The first sub-pixel 111 further includes a first light-emitting layer 1114. At least a portion of the first light-emitting layer 1114 is located in the first opening 161; and a region defined by the first opening 161 is the first effective light-emitting region 1115. The first anode 1110 can drive the first light-emitting layer 1114 to emit light.

For example, as shown in FIG. 7, an area of the first effective light-emitting region 1115 may be slightly smaller than an area of the first anode 1110, and the shape of the first effective light-emitting region 1115 may be similar to the shape of the first main portion 1112 of the first anode 1110, and a shortest distance between an edge of the first effective light-emitting region 1115 and an edge of the first main portion 1112 ranges from 1 to 5 microns.

It should be noted that the first light-emitting layer 1114 may include an electroluminescent layer itself and other functional layers on both sides of the electroluminescent layer, for example, the other functional layers may include a hole injection layer, a hole transport layer, an electron injection layer, an electron transport layer, and the like.

For example, in some examples, as shown in FIG. 7, the first sub-pixel 111 further includes a first cathode 1116, and the first cathode 1116 is located on a side of the first light-emitting layer 1115 away from the first anode 1112.

For example, in some examples, as shown in FIG. 7, the display substrate further includes: a planarization layer 230 between a film layer in which the plurality of signal line groups 120 are located and a film layer in which the first anode 1112 is located, and a height of each signal line group 120 in a direction perpendicular to the base substrate 101 ranges from 650 nm to 850 nm, and a thickness of the planarization layer 230 ranges from 1.4 μm to 1.6 μm. Because the signal line groups are generally made of a source-drain metal layer, and usually adopt a stacked structure, such as a Ti/Al/Ti stacked structure; the height (thickness) of each signal line group 120 in the direction perpendicular to the base substrate 101 is large, and the planarization layer 230 cannot completely planarize each signal line group 120, thereby causing the first anode on the planarization layer and the first light-emitting layer on the first anode to be uneven, and protrusions are generated on the first anode and the first light-emitting layer on the first anode. In this case, the display substrate can effectively reduce the asymmetry of the light emission of the first sub-pixel, and even eliminate the asymmetry of the light emission of the first sub-pixel, thereby alleviating and even eliminating the color shift phenomenon generated when viewed from the left side and the right side of the normal line of the display substrate at the same angle with respect to the normal line of the display substrate.

For example, in some examples, as shown in FIG. 7, the display substrate further includes a pixel driving circuit 220, the pixel driving circuit 220 is between the base substrate 101 and the planarization layer 230 and includes the signal line groups 120 described above. That is, the signal line groups 120 may be part of the pixel driving circuit 220. For example, the signal line groups 120 may be a set of signal lines formed by the source-drain metal layer in the pixel driving circuit 220. Of course, the pixel driving circuit in the embodiments of the present disclosure may refer to a general design. For example, the pixel driving circuit may further includes a thin film transistor, a capacitor, and the like, and details are not described herein again.

For example, in some examples, as shown in FIGS. 6 and 7, each signal line group 120 includes two signal lines 1200, and the first anode 1110 overlaps with four signal lines 1200 of the two adjacent signal line groups 120.

For example, in some examples, as shown in FIGS. 6 and 7, the at least one signal line 1200 included in each signal line group 120 includes a first signal line 121 and a second signal line 122, and a distance between the first signal line 121 and the second signal line 122 in one signal line group 120 is smaller than a distance between the two adjacent signal line groups 120. In this case, because the distance between the data line 121 and the power line 122 in one signal line group 120 is small, the signal line group 120 allows the first effective light-emitting region 1110 to form protrusions at positions where the first effective light-emitting region 1110 overlaps with the signal line group 120.

It should be noted that the distance between the first signal line 121 and the second signal line 122 in one signal line group 120 may be a width of an interval between the first signal line 121 and the second signal line 122 in one signal line group 120. In addition, in an actual display substrate, because of the limitation of the design and manufacture process of the pixel circuit, the first signal line is not an elongated straight line with a same width at each position, and the second signal line is not an elongated straight line with a same width at each position as well, the above distance between the first signal line 121 and the second signal line 122 may be an average width of the interval between the first signal line 121 and the second signal line 122, and the distance between the two adjacent signal line groups 120 may be an average width of an interval between the two adjacent signal line groups 120.

For example, in some examples, as shown in FIGS. 6 and 7, each signal line group 120 includes a data line 121 for transmitting a data signal and a power line 122 for transmitting a driving voltage, that is, the first signal line 121 may be a data line, and the second signal line 122 may be a power line 122.

For example, in some examples, as shown in FIGS. 6 and 7, in one signal line group 120, the data line 121 and the power line 122 are sequentially arranged in the first direction, that is, sequentially arranged from the left side to the right side in FIG. 6. The data line 121 is located on the left side of the power line 122. Arrangement orders of the data line 121 and the power line 122 in different signal line groups 120 are the same. Therefore, in the display substrate provided by the embodiments of the present disclosure, positions at which the two adjacent signal line groups overlapping with the first anode 1110 are located instead of the two signal line group themselves are substantially axisymmetric with respect to the first bisector of the first anode 1110.

For example, in some examples, as shown in FIGS. 6 and 7, where the signal line group 120 includes a plurality of data lines 1200, the plurality of data lines 1200 are spaced apart from each other and substantially parallel to each other. For example, where the signal line group 120 includes the data line 121 and the power line 122, the data line 121 and the power line 122 are spaced apart from each other and substantially parallel to each other.

For example, in some examples, a width of the data line 121 ranges from 2.5 to 3 microns, a width of the power line 122 ranges from 4 to 6 microns, and a distance between the data line 121 and the power line 122 ranges from 3 to 4 microns.

For example, in some examples, a distance between adjacent data lines ranges from 23 to 35 microns; and a distance between adjacent power lines ranges from 23 to 35 microns. A length of the first main portion 1112 along the first direction ranges from 45 to 60 microns, so that the first main portion 1112 can cover the two adjacent signal line groups 120.

For example, in some examples, as shown in FIG. 6, the first direction described above is perpendicular to the second direction described above.

For example, in some examples, as shown in FIG. 6, each sub-pixel group 120 further includes a second sub-pixel 112, the second sub-pixel 112 includes a second anode 1120, and the second anode 1120 overlaps with two adjacent signal line groups 120.

In the display substrate provided by the embodiments of the present disclosure, because the second anode overlaps with two adjacent signal line groups, the second anode may form two protrusions at positions where the second anode overlaps with the two adjacent signal line groups. The two protrusions can reduce the asymmetry of the light emission of the second anode and the light-emitting layer on the second anode, and even eliminate the asymmetry of the light emission of the second anode and the light-emitting layer on the second anode, thereby further alleviating and even eliminating the color shift phenomenon generated when viewed from the left side and the right side of the normal line of the display substrate at the same angle with respect to the normal line of the display substrate.

Figure 8:
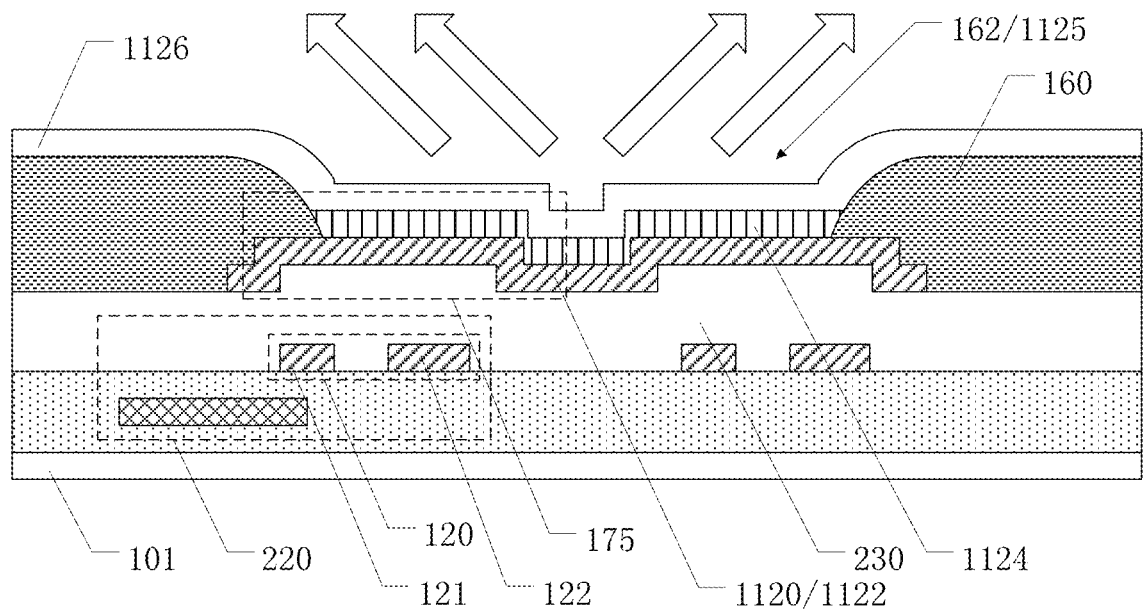
FIG. 8 is a structural schematic diagram of another display substrate provided by an embodiment of the present disclosure.

FIG. 8 is a structural schematic diagram of another display substrate provided by an embodiment of the present disclosure. As shown in FIG. 8, because the second anode 1120 overlaps with two adjacent signal line groups 120, the second anode 1120 forms two protrusions 175 at positions where the second anode 1120 overlap with the two adjacent signal line groups 120. It can be seen that, compared with only one protrusion, the two protrusions 175 can reduce the asymmetry of the light emission of the second anode 1120 and the light-emitting layer on the second anode 1120, and even eliminate the asymmetry of the light emission of the second anode 1120 and the light-emitting layer on the second anode 1120, thereby further alleviating and even eliminating the color shift phenomenon generated when viewed from the left side and the right side of the normal line of the display substrate at the same angle with respect to the normal line of the display substrate.

For example, in some examples, as shown in FIG. 6, orthographic projections of signal lines 1200 in the two signal line groups 120 overlapping with the second anode 1120 on the base substrate 101 extend in the second direction and pass through an orthographic projection of the second anode 1120 on the base substrate 101.

For example, in some examples, as shown in FIGS. 6 and 8, the second sub-pixel 112 includes a second effective light-emitting region 1125, the second anode 1120 includes a second main portion 1122, and the second main portion 1122 at least partially overlaps with the second effective light-emitting region 1125. A size of the second main portion 1122 in the first direction is larger than a size of the second main portion 1122 in the second direction, and positions at which the two adjacent signal line groups 120 overlapping with the second anode 1120 are located are at two ends of the second main portion 1122 in the first direction. In this case, because the positions at which the two adjacent signal line groups 120 overlapping with the second anode 1120 are located are at two ends of the second main portion 1122 in the first direction, the symmetry of the two protrusions 175 formed at the positions at which the second anode 1120 overlaps with two adjacent signal line groups is high, thereby alleviating and even eliminating the color shift phenomenon generated when viewed from the left side and the right side of the normal line of the display substrate at the same angle with respect to the normal line of the display substrate. It should be noted that FIG. 6 only shows the second main portion of the second anode.

For example, in some examples, as shown in FIGS. 6 and 8, an orthographic projection of the second main portion 1122 on the base substrate 101 is substantially in a strip shape, and an extending direction of the second main portion intersects the second direction.

For example, in some examples, as shown in FIGS. 6 and 8, the extending direction of the second main portion is substantially perpendicular to the second direction.

For example, in some examples, as shown in FIGS. 6 and 8, the positions at which the two adjacent signal line groups 120 overlapping with the second anode 1120 are located are substantially axisymmetric with respect to a second bisector of the second main portion 1122, and the second bisector is parallel to the second direction. In this case, as shown in FIG. 8, the second anode 1120 forms two position-symmetric protrusions 175 at positions where the second anode 1120 overlaps with the two adjacent signal line groups 120, and the two protrusions 175 can effectively reduce the asymmetry of the light emission of the second anode and the light-emitting layer on the second anode, and even eliminate the asymmetry of the light emission of the second anode and the light-emitting layer on the second anode, thereby further alleviating and even eliminating the color shift phenomenon generated when viewed from the left side and the right side of the normal line of the display substrate at the same angle with respect to the normal line of the display substrate.

For example, in some examples, as shown in FIG. 6, a size of the second main portion 1122 in the first direction is larger than a size of the second main portion 1122 in the second direction. That is, a shape of the second main portion 1122 is a strip shape, such as a hexagon shape or an ellipse shape. As shown in FIG. 1, because a size of a normal anode in the second direction is larger than a size of the normal anode in the first direction, the normal anode generally only cover one signal line group. The size of the second main portion of the second anode provided by the embodiments of the present disclosure in the first direction is larger than the size of the second main portion in the second direction, so that the second anode can overlap with two adjacent signal line groups under the same area. For example, the second main portion provided by the embodiments of the present disclosure may be obtained by rotating the main portion of the corresponding anode in the display substrate shown in FIG. 1 by 90 degrees.

For example, in some examples, as shown in FIGS. 6 and 8, each signal line group 120 includes two signal lines 1200, and the second anode 1120 overlaps with four signal lines 1200 of the two adjacent signal line groups 120. For example, the size of the second main portion 1122 in the first direction ranges from 45 to 55 microns; and the size of the second main portion 1122 in the second direction ranges from 12 to 20 microns. It should be noted that the above sizes are only illustrative examples, and the sizes of the second main portion in the embodiments of the present disclosure may be determined according to the size and resolution of the actual product.

For example, in some examples, as shown in FIG. 6, the second main portion 1122 is substantially in a hexagon shape or an elliptical shape, and a long symmetrical axis of the hexagon shape or a long axis of the ellipse shape may be parallel to the first direction. It should be noted that the above "substantially parallel" means that an angle between the long symmetrical axis of the hexagon shape or the long axis of the ellipse and the first direction does not exceed 5 degrees.

It should be noted that the embodiments of the present disclosure include but are not limited thereto, and the shape of the second main portion in the embodiments of the present disclosure may also be other long strip shapes; in addition, where the second main portion is substantially in the hexagon shape or the ellipse shape, the long symmetrical axis of the hexagon shape or the long axis of the ellipse shape may not be parallel to the first direction, as long as the orthographic projection of the second anode on the plane in which the signal line groups are located overlaps with the two adjacent signal line groups.

For example, in some examples, as shown in FIG. 6, the display substrate further includes a pixel defining layer 160 on a side of the second anode 1120 away from the base substrate 101 and including a second opening 162. The first sub-pixel 112 further includes a second light-emitting layer 1124. At least a portion of the second light-emitting layer 1124 is located in the second opening 162. A region defined by the second opening 162 is the second effective light-emitting region 1125. The second anode 1120 can drive the second light-emitting layer 1124 to emit light.

For example, as shown in FIG. 8, an area of the second effective light-emitting region 1125 may be slightly smaller than an area of the second anode 1120, and a shape of the second effective light-emitting region 1125 may be similar to a shape of the second main portion 1122 of the second anode 1120. A shortest distance between an edge of the second effective light-emitting region 1125 and an edge of the second main portion 1122 ranges from 1 to 5 microns.

It should be noted that the second light-emitting layer 1124 may includes an electroluminescent layer itself and other functional layers on both sides of the electroluminescent layer, for example, the other functional layers may include a hole injection layer, a hole transport layer, an electron injection layer, an electron transport layer, and the like.

For example, in some examples, as shown in FIG. 8, the second sub-pixel 112 further includes a second cathode 1126, and the second cathode 1126 is located on a side of the second light-emitting layer 1125 away from the second anode 1122.

Figure 9A:
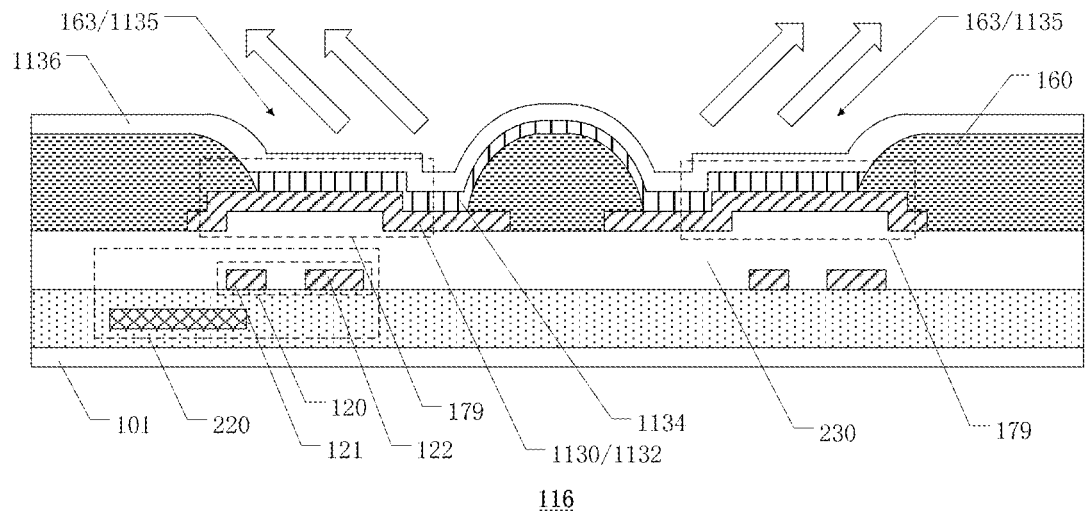
FIG. 9A is a structural schematic diagram of another display substrate provided by an embodiment of the present disclosure.

For example, in some examples, as shown in FIG. 6, each sub-pixel group 110 further includes a third sub-pixel pair 116; the third sub-pixel pair 116 includes two third sub-pixels 113; each third sub-pixel 113 includes a third anode 1130, two third anodes 1130 of the third sub-pixel pair 116 respectively overlap with one signal line group 120, and the two signal line groups overlapping with the two third anodes 1130 of the third sub-pixel pair 116 120 are adjacent to each other, that is, two adjacent signal line groups 120. FIG. 9A is a structural schematic diagram of another display substrate provided by an embodiment of the present disclosure. As shown in FIG. 9A, the third sub-pixel pair 116 is regarded as a whole, because each of the two third anodes 1130 of the third sub-pixel pair 116 overlaps with one signal line group 120, and two signal line groups 120 overlapping with two third anodes 1130 of the third sub-pixel pair 116 are adjacent to each other, two protrusions 179 are formed at positions where the two third anodes 1130 of the third sub-pixel pair 116 respectively overlap with the two adjacent signal line groups 120. The two protrusions 179 can reduce the asymmetry of the light emission of the third sub-pixel pair 116, and even eliminate the asymmetry of the light emission of the third sub-pixel pair 116, thereby further alleviating and even eliminating the color shift phenomenon generated when viewed from the left side and the right side of the normal line of the display substrate at the same angle with respect to the normal line of the display substrate.

For example, in some examples, as shown in FIG. 6, orthographic projections of the signal lines 1200 in the signal line group 120 overlapping with the third anode 1130 on the base substrate 101 extend in the second direction and pass through an orthographic projection of the third anode 1130 on the base substrate 101.

For example, in some examples, as shown in FIG. 6, the third sub-pixel 113 includes a third effective light-emitting region 1135, the third anode 1130 includes a third main portion 1132, and the third main portion 1132 at least partially overlaps with the third effective light-emitting region 1135. The two signal line groups 120 respectively overlapping with the two third anodes 1130 of the third sub-pixel pair 116 are substantially axisymmetric with respect to a third bisector of a line connecting centers of the two third main portions 1132, and the third bisector is parallel to the second direction. In this case, as shown in FIG. 9A, the two anodes 1130 or the two third effective light-emitting regions 1135 form two position-symmetric protrusions 179 at positions where the two anodes 1130 or the two third effective light-emitting regions 1135 respectively overlap with the two adjacent signal line groups 120, the two protrusions 179 can further effectively reduce the asymmetry of the light emission of the third sub-pixel pair 116, and even eliminate the asymmetry of the light emission of the third sub-pixel pair 116, thereby further alleviating and even eliminating the color shift phenomenon generated when viewed from the left side and the right side of the normal line of the display substrate at the same angle with respect to the normal line of the display substrate.

For example, in some examples, as shown in FIG. 6, each signal line group 120 includes two signal lines 1200, each of the two third anodes 1130 of the third sub-pixel pair 116 overlaps with two signal lines in one signal line group 1200, and the two signal line groups respectively overlapping with the two third anodes 1130 of the third sub-pixel pair 116 are adjacent to each other. For example, in some examples, as shown in FIG. 6, the plurality of sub-pixel groups 110 are arranged along the second direction to form a plurality of sub-pixel group columns, and are arranged in the first direction to form a plurality of sub-pixel group rows. Two adjacent sub-pixel group columns are misaligned by ½ pitch, and are misaligned by ½ pitch in the second direction. The pitch is equal to a distance between centers of two first sub-pixels 111 in two adjacent sub-pixel groups 110 in the second direction. In each sub-pixel group 110, the first sub-pixel 111, the second sub-pixel 112, and the third sub-pixel pair 116 are arranged along the second direction, and the two third sub-pixels 113 of the third sub-pixel pair 116 are arranged along the first direction. That is, each sub-pixel group can be a repeating unit in the display substrate.

For example, in some examples, the first sub-pixel 111 is configured to emit light of a first color, the second sub-pixel 112 is configured to emit light of a second color, and the third sub-pixel 113 is configured to emit light of a third color.

For example, in some examples, the first color is blue, the second color is red, and the third color is green. Therefore, the display substrate is in an arrangement structure of red, green, and blue sub-pixels. Of course, the embodiments of the present disclosure include but are not limited thereto. The first color, the second color, and the third color described above may also be other colors.

For example, in some examples, as shown in FIG. 6, the third main portion 1132 is substantially in a pentagon shape, and a right-angled side of the pentagon shape is substantially parallel to the second direction.

For example, in some examples, a size of the third main portion 1132 in the first direction ranges from 23 to 27 microns, and a size of the third main portion 1132 in the second direction ranges from 18 to 22 microns.

For example, in some examples, as shown in FIG. 9A, in the case where the sub-pixel group 110 includes the third sub-pixel 113, the third sub-pixel 113 further includes a third light-emitting layer 1134. In this case, the pixel defining layer 160 further includes a third opening 163, the third opening 163 exposes the third anode 1130, and at least a portion of the third light-emitting layer 1134 is located in the third opening 163 and covers a portion of the third anode 1130 that is exposed. A region defined by the third opening 163 is a third effective light-emitting region 1135 of the third sub-pixel 113.

It should be noted that an area of the third main portion 1132 of the third anode 1130 may be slightly larger than an area of the third light-emitting layer 1134. In addition, the third light-emitting layer 1134 may include an electroluminescent layer itself and other functional layers on both sides of the electroluminescent layer, for example, the other functional layers may include a hole injecting layer, a hole transporting layer, an electron injecting layer, an electron transporting layer, and the like.

Figure 9B:
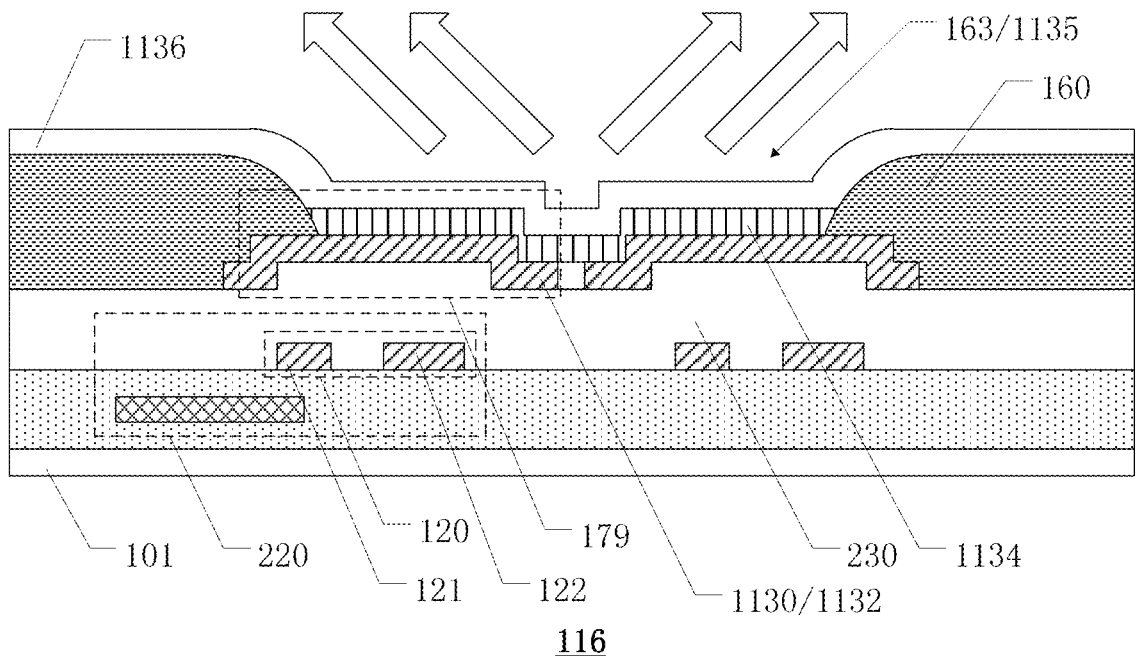
FIG. 9B is a structural schematic diagram of another display substrate provided by an embodiment of the present disclosure.

FIG. 9B is a structural schematic diagram of another display substrate provided by an embodiment of the present disclosure. For example, as shown in FIG. 9B, two third effective light-emitting regions 1135 in one third sub-pixel pair 116 may share one third opening 163, that is, the area of the third opening 163 is slightly larger than areas of two third effective light-emitting regions 1135, and an area of the light-emitting layer in the third opening 1135 may be slightly larger than areas of the two third main portions 1132. In this case, the third effective light-emitting region 1135 may be an overlapping region of the third opening 163 and the third main portion 1132.

For example, in some examples, as shown in FIG. 9B, each third sub-pixel 113 further includes a third cathode 1136, and the third cathode 1136 is located on a side of the third light-emitting layer 1135 away from the third anode 1132.

It should be noted that each effective light-emitting region (for example, the first effective light-emitting region, the second effective light-emitting region, or the third effective light-emitting region) is generally designed to be in a regular shape, such as the above-mentioned hexagon shape, pentagon shape, or ellipse shape. However, in the actual manufacturing process, the shape of the formed effective light-emitting region is generally deviated from the regular shape of the above design. For example, each corner of the above regular shape may be rounded, and therefore the shape of each effective light-emitting region (for example, the first effective light-emitting region, the second effective light-emitting region, or the third effective light-emitting region) may be a rounded shape. In addition, the shape of the actually formed effective light-emitting region may also have other variations from the designed shape. For example, the shape of the effective light-emitting region designed as the hexagon shape may become approximately an ellipse shape in the actual manufacture process.

For example, in some examples, as shown in FIG. 6, where the first sub-pixel 111 is a blue sub-pixel, the second sub-pixel 112 is a red sub-pixel, and the third sub-pixel 113 is a green sub-pixel, an area of the first light-emitting layer 1114 of the first sub-pixel 111 and an area of the second light-emitting layer 1124 of the second sub-pixel 112 are both larger than an area of the third light-emitting layer 1134 of a single third sub-pixel 113, and the area of the first light-emitting layer 1114 of the first sub-pixel 111 is larger than the area of second light-emitting layer 1124 of the second sub-pixel 112.

An embodiment of the present disclosure provides a display substrate. As shown in FIG. 6, the display substrate includes: a base substrate 101, a plurality of sub-pixel groups 110, and a plurality of signal line groups 120, the plurality of sub-pixel groups 110 and the plurality of signal line groups 120 are arranged on the base substrate 101. The plurality of signal line groups 120 are arranged along a first direction and are spaced apart from each other, and each of the signal line groups 120 includes a first signal line 121 and a second signal line 122. Both the first signal line 121 and the second signal line 122 extend along a second direction intersecting the first direction. In each of the signal line groups 120, the first signal line 121 and the second signal line 122 are sequentially arranged, and arrangement orders of the first signal line 121 and the second signal line 122 of two adjacent signal line groups 120 are the same. The plurality of sub-pixel groups 110 are arranged along the second direction to form a plurality of sub-pixel group columns, and are arranged along the first direction to form a plurality of sub-pixel group rows, and two adjacent sub-pixel group columns are misaligned by ½ pitch, and the pitch is equal to a distance between centers of two first sub-pixels in two adjacent sub-pixel groups in the second direction. Each of the sub-pixel groups 110 includes a first sub-pixel 111, a second sub-pixel 112, and a third sub-pixel pair 116. The third sub-pixel pair 116 includes two third sub-pixels 113. In each of the sub-pixel groups 110, the first sub-pixel 111, the second sub-pixel 112, and the third sub-pixel pair 116 are arranged along the second direction, and the two third sub-pixels 113 of the third sub-pixel pair 116 are arranged along the first direction. The first sub-pixel 111 includes a first anode 1110, the second sub-pixel 112 includes a second anode 1120, and the third sub-pixel 113 includes a third anode 1130. The first anode 1110 overlaps with two adjacent signal line groups 120, the second anode 1120 overlaps with two adjacent signal line groups 120, and each of two third anodes 1130 of the third sub-pixel pair 116 overlaps with one signal line group 120, and two signal line groups 120 respectively overlapping with the two third anodes 1130 of the third sub-pixel pair 116 are adjacent to each other.

An embodiment of the present disclosure further provides a display device. The display device includes the above display substrate. Therefore, the display device can also effectively reduce the asymmetry of the light emission of the anode and the light-emitting layer (for example, the first anode and the first light-emitting layer on the first anode, the second anode and the second light-emitting layer on the second anode, and third anode and the third light-emitting layer on the third anode) on the anode of each sub-pixel, and even eliminate the asymmetry of the light emission of the effective light-emitting regions, thereby alleviating and even eliminating the color shift phenomenon generated when viewed from the left side and the right side of the normal line of the display substrate at the same angle with respect to the normal line of the display substrate, and improving display quality and optimizing the user experience.

For example, in some examples, the display device may be any product or component having a display function, such as a smartphone, a tablet, a television, a display, a notebook, a digital photo frame, a navigator, and the like.

An embodiment of the present disclosure further provides a display substrate. As shown in FIGS. 6 and 7, the display substrate includes a base substrate 101, a plurality of sub-pixel groups 110, and a plurality of signal line groups 120. The plurality of sub-pixel groups 110 and the plurality of signal line groups 120 are arranged on the base substrate 101. The plurality of signal line groups 120 are arranged along a first direction, and are spaced apart from each other. Each of the signal line groups 120 includes two signal lines 1200; and the signal lines 1200 extend along a second direction intersecting the first direction. Each of the sub-pixel groups 110 includes a blue sub-pixel 111 and a red sub-pixel 112. The blue sub-pixel 111 includes a first anode 1110, and the red sub-pixel 112 includes a second anode 1120. The first anode 1110 overlaps with four signal lines 1200 of two adjacent signal line group 120, and the second anode 1120 overlaps with four signal lines 1200 of two adjacent signal line groups 120.

In the display substrate provided by the embodiments of the present disclosure, because each of the first anode 1110 of the blue sub-pixel 111 and the second anode 1120 of the red sub-pixel 112 overlaps with four signal lines 1200 of two adjacent signal line groups 120 simultaneously, in this case, even if the first anode 1110 forms protrusions at positions where the first anode 1110 overlaps with the signal line groups 120, the first anode 1110 forms two protrusions at positions where the first anode 1110 overlaps with the two adjacent signal line groups 120, and the two protrusions can reduce the asymmetry of the light emission of the first anode 1110 and the light-emitting layer on the first anode 1110, and can even eliminate the asymmetry of the light emission of the first anode 1110 and the light-emitting layer on the first anode 1110, thereby alleviating and even eliminating the color shift phenomenon generated when viewed from the left side and the right side of the normal line of the display substrate at the same angle with respect to the normal line of the display substrate. Similarly, even if the second anode 1120 forms protrusions at positions where the second anode 1120 overlaps with the signal line groups 120, the second anode 1120 forms two protrusions at positions where the second anode 1120 overlaps with the two adjacent signal line groups 120, and the two protrusions can reduce the asymmetry of the light emission of the second anode 1120 and the light-emitting layer on the second anode 1120, and can even eliminate the asymmetry of the light emission of the second anode 1120 and the light-emitting layer on the second anode 1120, thereby alleviating and even eliminating the color shift phenomenon generated when viewed from the left side and the right side of the normal line of the display substrate at the same angle with respect to the normal line of the display substrate.

For example, in some examples, the two signal lines 1200 included in each signal line group 120 may be a data line 121 and a power line 122. The data line 121 is used for transmitting or writing data, and the power line 122 is used for transmitting a driving voltage. Because thicknesses of the data line and the power line are large, the planarization layer covering the data line and the power line cannot completely planarize the display substrate, causing the anode on the planarization layer and the light-emitting layer on the anode to be uneven, and therefore protrusions are generated on the anode and the light-emitting layer on the anode. The display substrate provided by the embodiments of the present disclosure can eliminate the asymmetry of the light emission of light-emitting layers on the first anode and the second anode by allowing each of the first anode and the second anode to overlap with four signal lines of two adjacent signal line groups simultaneously, thereby eliminating the asymmetry of the light emission of light-emitting layers on the first anode and the second anode, and further alleviating and even eliminating the color shift phenomenon generated when viewed from the left side and the right side of the normal line of the display substrate at the same angle with respect to the normal line of the display substrate.

For example, in some examples, as shown in FIG. 6, orthogonal projections of the four signal lines 1200 overlapping with the first anode 1110 on the base substrate 101 extend along the second direction and pass through an orthographic projection of the first anode 1110 on the base substrate. Orthographic projections of the four signal lines 1200 overlapping with the second anode 1120 on the base substrate 101 extend along the second direction and pass through an orthographic projection of the second anode 1120 on the base substrate 101.

For example, in some examples, as shown in FIG. 6, each of the sub-pixel groups 110 further includes a green sub-pixel pair 116, and each green sub-pixel pair 116 includes two green sub-pixels 113. Each of the green sub-pixels 113 includes a third anode 1130, and each of two third anodes 1130 of the green sub-pixel pair 116 overlaps with two signal lines 1200 of one signal line group 120, and two signal line groups 120 respectively overlapping with the two third anode 1130 of the third sub-pixel pair 116 are adjacent to each other. In this case, the third sub-pixel pair 116 is regarded as a whole, because each of the two third anodes 1130 of the third sub-pixel pair 116 overlaps with one signal line group 120, and the two signal line groups 120 respectively overlapping with the two third anodes 1130 are adjacent to each other, two protrusions are formed at positions where each of the two third anodes 1130 of the third sub-pixel pair 116 overlaps with the two adjacent signal line groups 120. The two protrusions can reduce the asymmetry of the light emission of the third sub-pixel pair 116, and even eliminate the asymmetry of the light emission of the third sub-pixel pair 116, thereby further alleviating and even eliminating the color shift phenomenon generated when viewed from the left side and the right side of the normal line of the display substrate at the same angle with respect to the normal line of the display substrate.

At least one embodiment of the present disclosure further provides a display substrate. As shown in FIGS. 6 and 7, the display substrate includes a base substrate 101, a plurality of sub-pixel groups 110, and a plurality of signal line groups 120. The plurality of sub-pixel groups 110 and the plurality of signal line groups 120 are arranged on the base substrate 101. The plurality of signal line groups 120 are arranged along a first direction and are spaced apart from each other. Each of the signal line groups 120 includes a first signal line 121 and a second signal line 122. The first signal line 121 and the second signal line 122 extend along a second direction intersecting the first direction. Each of the sub-pixel groups 110 includes a first sub-pixel 111, the first sub-pixel 111 includes a first anode 1110 and a first effective light-emitting region 1115. The first anode 1110 includes a first main portion 1112, and the first main portion 1112 at least partially overlaps with the first effective light-emitting region 1115. A size of an interval between two adjacent signal line groups 120 in the first direction is 8-10 times of a size of the first signal line 121 in the first direction; a size of the first main portion 1112 in the first direction is 15-17 times of the size of the first signal line 121 in the first direction, and a size of the first main portion 1112 in the second direction is 9-11 times of the size of the first signal line 121 in the first direction. Because the size of the first main portion 1112 in the first direction is 15-17 times of the size of the first signal line 121 in the first direction, the first main portion 1112 can cover two adjacent signal line groups 120. In this case, even if the first anode 1110 forms protrusions at positions where the first anode 1110 overlaps with the signal line groups 120, the first anode 1110 forms two protrusions at positions where the first anode 1110 overlaps with the two adjacent signal line groups 120, and the two protrusions can reduce the asymmetry of the light emission of the first anode 1110 and the light-emitting layer on the first anode 1110, and can even eliminate the asymmetry of the light emission of the first anode 1110 and the light-emitting layer on the first anode 1110, thereby alleviating and even eliminating the color shift phenomenon generated when viewed from the left side and the right side of the normal line of the display substrate at the same angle with respect to the normal line of the display substrate.

For example, in some examples, a ratio of the size of the first main portion 1112 in the first direction to the size of the first main portion 1112 in the second direction is γ1, and a value of γ1 ranges from 1.5 to 1.7.

For example, in some examples, each sub-pixel group 110 further includes a second sub-pixel 112, the second sub-pixel 112 includes a second anode 1120 and a second effective light-emitting region 1125. The second anode 1120 includes a second main portion 1122. The second main portion 1122 overlaps with the second effective light-emitting region 1125. A size of an interval between two adjacent signal line groups 120 in the first direction is 8-10 times of the size of the first signal line 121 in the first direction. A size of the second main portion 1122 in the first direction is 12-14 times of the size of the first signal line in the first direction, and a size of the second main portion in the second direction is 4-6 times of the size of the first signal line in the first direction. Because the size of the second main portion 1122 in the first direction is 12-14 times of the size of the first signal line in the first direction, the second main portion 1122 can cover two adjacent signal line groups 120. In this case, even if the second anode 1120 forms protrusions at positions where the second anode 1120 overlaps with the signal line groups 120, the second anode 1120 forms two protrusions at positions where the second anode 1120 overlaps with the two adjacent signal line groups 120, and the two protrusions can reduce the asymmetry of the light emission of the second anode 1120 and the light-emitting layer on the second anode 1120, and can even eliminate the asymmetry of the light emission of the second anode 1120 and the light-emitting layer on the second anode 1120, thereby alleviating and even eliminating the color shift phenomenon generated when viewed from the left side and the right side of the normal line of the display substrate at the same angle with respect to the normal line of the display substrate.

For example, in some examples, a ratio of the size of the second main portion 1122 in the first direction to the size of the second main portion 1122 in the second direction is γ2, and a value of γ2 ranges from 2.2 to 2.6.

For example, in some examples, each sub-pixel group 110 further includes a third sub-pixel pair 116, each third sub-pixel pair 116 includes two third sub-pixels 113, and each third sub-pixel 113 includes a third anode 1130 and a third effective light-emitting region 1135. The third anode 1130 includes a third main portion 1132, and the third main portion 1132 at least partially overlaps with the third effective light-emitting region 1135. A size of an interval between two adjacent signal line groups 120 in the first direction is 8-10 times of the size of the first signal line 121 in the first direction, and a size of the third main portion 1132 in the first direction is 6-8 times of the size of the first signal line 121 in the first direction, and a size of the third main portion 1132 in the second direction is 7-9 times of the size of the first signal line 121 in the first direction.

For example, in some examples, a size of the second signal line 122 in the first direction is 1.3-1.4 times of the size of the first signal line 121 in the first direction.

For example, in some examples, an orthographic projection of the first effective light-emitting region 1115 on the base substrate 101 is within an orthographic projection of the first anode 1112 on the base substrate 101, and a shortest distance between an edge of the orthographic projection of the first effective light-emitting region 1115 on the base substrate 101 and an edge of the orthographic projection of the first anode 1112 on the base substrate 101 ranges from 1 to 3 microns. An orthographic projection of the second effective light-emitting region 1125 on the base substrate 101 is within an orthographic projection of the second anode 1122 on the base substrate 101, and a shortest distance between an edge of the orthographic projection of the second effective light-emitting region 1125 on the base substrate 101 and an edge of the orthographic projection of the second anode 1122 on the base substrate 101 ranges from 1 to 3 microns. An orthographic projection of the third effective light-emitting region 1135 on the base substrate 101 is within an orthographic projection of the third anode 1132 on the base substrate 101, and a shortest distance between an edge of the orthographic projection of the third effective light-emitting region 1135 on the base substrate 101 and an edge of the orthographic projection of the third anode 1132 on the base substrate 101 ranges from 1 to 3 microns.

For example, in some examples, the first sub-pixel is a blue sub-pixel, the second sub-pixel is a red sub-pixel, and the third sub-pixel is a green sub-pixel.

At least one embodiment of the present disclosure further provides a display substrate. As shown in FIGS. 6 and 7, the display substrate includes a base substrate 101, a plurality of sub-pixel groups 110, and a plurality of signal line groups 120. The plurality of sub-pixel groups 110 and the plurality of signal line groups 120 are arranged on the base substrate 101. The plurality of signal line groups 120 are arranged along a first direction and are spaced apart from each other. Each of the signal line groups 120 includes a first signal line 121 and a second signal line 122. The first signal line 121 and the second signal line 122 extend along a second direction intersecting the first direction. Each sub-pixel group 110 includes a blue sub-pixel 111 and a red sub-pixel 112. The blue sub-pixel 111 includes a first anode 1110 and a first effective light-emitting region 1115. The red sub-pixel 112 includes a second anode 1120 and a second effective light-emitting region 1125. The first anode 1110 includes a first main portion 1112, and the first main portion 1112 at least partially overlaps with the first effective light-emitting region 1115. The second anode 1120 includes a second main portion 1122, and the second main portion 1122 at least partially overlaps with the effective light-emitting regions 1125. An orthographic projection of the first main portion 1112 on the base substrate 101 is substantially in a strip shape, and an extending direction of the first main portion 1112 intersects with the second direction. An orthographic projection of the second main portion 1122 on the base substrate 101 is substantially in a strip shape, and an extending direction of the second main portion 1122 intersects with the second direction. It should be noted that the extending direction of the first main portion and the extending direction of the second main portion may be the same as or different from the first direction.

In the display substrate provided by the embodiments of the present disclosure, because the extending direction of the first main portion 1112 of the first anode 1110 of the first sub-pixel 111 intersects with the second direction, the first main portion 1112 can cover two adjacent signal line groups 120. In this case, even if the first anode 1110 forms protrusions at positions where the first anode 1110 overlaps with the signal line groups 120, the first anode 1110 forms two protrusions at positions where the first anode 1110 overlaps with the two adjacent signal line groups 120, and the two protrusions can reduce the asymmetry of the light emission of the first anode 1110 and the light-emitting layer on the first anode 1110, and can even eliminate the asymmetry of the light emission of the first anode 1110 and the light-emitting layer on the first anode 1110, thereby alleviating and even eliminating the color shift phenomenon generated when viewed from the left side and the right side of the normal line of the display substrate at the same angle with respect to the normal line of the display substrate. Similarly, because the extending direction of the second main portion 1122 of the second anode 1120 of the second sub-pixel 112 intersects with the second direction, the second main portion 1122 can cover two adjacent signal line groups 120. In this case, even if the second anode 1120 forms protrusions at positions where the second anode 1120 overlaps with the signal line groups 120, the second anode 1120 forms two protrusions at positions where the second anode 1120 overlaps with the two adjacent signal line groups 120, and the two protrusions can reduce the asymmetry of the light emission of the second anode 1120 and the light-emitting layer on the second anode 1120, and can even eliminate the asymmetry of the light emission of the second anode 1120 and the light-emitting layer on the second anode 1120, thereby alleviating and even eliminating the color shift phenomenon generated when viewed from the left side and the right side of the normal line of the display substrate at the same angle with respect to the normal line of the display substrate.

For example, in some examples, as shown in FIG. 6, the extending direction of the first main portion 1112 is substantially perpendicular to the second direction, and the extending direction of the second main portion 1122 is substantially perpendicular to the second direction. In this case, where lengths (sizes in the extending direction of the first main portion 1112 and the second main portion 1122) of the first main portion 1112 and the second main portion 1122 are sufficiently large, it is ensured that the first main portion 1112 can cover two adjacent signal line groups 120, and the second main portion 1122 can cover two adjacent signal line groups 120. It should be noted that the above "substantially perpendicular" includes a case where an angle between the extending direction of the first main portion or the extending direction of the second main portion and the second direction ranges from 85 to 95 degrees.

For example, in some examples, as shown in FIG. 6, the first direction is perpendicular to the second direction. In this case, the extending direction of the first main portion 1112 may be substantially parallel to the first direction, and the extending direction of the second main portion 1122 may be substantially parallel to the first direction. It should be noted that the above "substantially parallel" includes a case where an angle between the extending direction of the first main portion or the extending direction of the second main portion and the first direction ranges from 0 to 5 degrees.

For example, in some examples, the size of the interval between two adjacent signal line groups 120 in the first direction is 8-10 times of the size of the first signal line 121 in the first direction; the size of the first main portion 1112 in the first direction is 15-17 times of the size of the first signal line 121 in the first direction, and the size of the first main portion 1112 in the second direction is 9-11 times of the size of the first signal line 121 in the first direction. Because the size of the first main portion 1112 in the first direction is 15-17 times of the size of the first signal line 121 in the first direction, the first main portion 1112 can cover two adjacent signal line groups. In this case, even if the first anode 1110 forms protrusions at positions where the first anode 1110 overlaps with the signal line groups 120, the first anode 1110 forms two protrusions at positions where the first anode 1110 overlaps with the two adjacent signal line groups 120, and the two protrusions can reduce the asymmetry of the light emission of the first anode 1110 and the light-emitting layer on the first anode 1110, and can even eliminate the asymmetry of the light emission of the first anode 1110 and the light-emitting layer on the first anode 1110, thereby alleviating and even eliminating the color shift phenomenon generated when viewed from the left side and the right side of the normal line of the display substrate at the same angle with respect to the normal line of the display substrate.

For example, in some examples, the size of the first signal line 121 in the first direction ranges from 3 to 4 microns.

For example, in some examples, the size of the interval between two adjacent signal line groups 120 in the first direction is 8-10 times of the size of the first signal line 121 in the first direction, and the size of the second main portion 1122 in the first direction is 12-14 times of the size of the first signal line in the first direction, and the size of the second main portion in the second direction is 4-6 times of the size of the first signal line in the first direction. Because the size of the second main portion 1122 in the first direction is 12-14 times of the size of the first signal line 121 in the first direction, the second main portion 1122 can cover two adjacent signal line groups 120. In this case, even if the second anode 1120 forms protrusions at positions where the second anode 1120 overlaps with the signal line groups 120, the second anode 1120 forms two protrusions at positions where the second anode 1120 overlaps with the two adjacent signal line groups 120, and the two protrusions can reduce the asymmetry of the light emission of the second anode 1120 and the light-emitting layer on the second anode 1120, and can even eliminate the asymmetry of the light emission of the second anode 1120 and the light-emitting layer on the second anode 1120, thereby alleviating and even eliminating the color shift phenomenon generated when viewed from the left side and the right side of the normal line of the display substrate at the same angle with respect to the normal line of the display substrate.

For example, in some examples, the size of the second signal line 122 in the first direction is 1.3-1.4 times of the size of the first signal line 121 in the first direction. That is, the width of the second signal line 122 is wide, thereby facilitating the transmission of the driving voltage.

For example, in some examples, each sub-pixel group 120 further includes a green sub-pixel pair 116, each green sub-pixel pair 116 includes two green sub-pixels 113, and each green sub-pixel 113 includes a third anode 1130 and a third effective light-emitting region 1135. The third anode 1130 includes a third main portion 1132, and the third main portion 1132 at least partially overlaps with the third effective light-emitting region 1135. The third main portion 1132 covers one signal line group 120, and two signal line groups 120 respectively overlapping with two third main portions 1132 of the green sub-pixel pair 116 are adjacent to each other. In this case, the third sub-pixel pair 116 is regarded as a whole, because each of the two third anodes 1130 of the third sub-pixel pair 116 overlaps with one signal line group 120, and the two signal line groups 120 respectively overlapping with the two third anodes 1130 of the third sub-pixel pair 116 are adjacent to each other, two protrusions are formed at positions where each of the two third anodes 1130 of the third sub-pixel pair 116 overlaps with the two adjacent signal line groups 120. The two protrusions can reduce the asymmetry of the light emission of the third sub-pixel pair 116, and even eliminate the asymmetry of the light emission of the third sub-pixel pair 116, thereby alleviating and even eliminating the color shift phenomenon generated when viewed from the left side and the right side of the normal line of the display substrate at the same angle with respect to the normal line of the display substrate.

For example, in some examples, the size of the interval between two adjacent signal line groups 120 in the first direction is 8-10 times of the size of the first signal line 121 in the first direction, and the size of the third main portion 1132 in the first direction is 6-8 times of the size of the first signal line 121 in the first direction, and the size of the third main portion 1132 in the second direction is 7-9 times of the size of the first signal line 121 in the first direction. In this case, in one third sub-pixel pair 116, a sum of the sizes of the two third main portions 1132 in the first direction is at least 12-16 times of the size of the first signal line 121 in the first direction, and therefore the two third main portions 1132 can overlap with the two adjacent signal line groups 120.

For example, in some examples, an orthographic projection of the first effective light-emitting region 1115 on the base substrate 101 is within an orthographic projection of the first anode 1112 on the base substrate 101, and a shortest distance between an edge of the orthographic projection of the first effective light-emitting region 1115 on the base substrate 101 and an edge of the orthographic projection of the first anode 1112 on the base substrate 101 ranges from 1 to 3 microns. An orthographic projection of the second effective light-emitting region 1125 on the base substrate 101 is within an orthographic projection of the second anode 1122 on the base substrate 101, and a shortest distance between an edge of the orthographic projection of the second effective light-emitting region 1125 on the base substrate 101 and an edge of the orthographic projection of the second anode 1122 on the base substrate 101 ranges from 1 to 3 microns. An orthographic projection of the third effective light-emitting region 1135 on the base substrate 101 is within an orthographic projection of the third anode 1132 on the base substrate 101, and a shortest distance between an edge of the orthographic projection of the third effective light-emitting region 1135 on the base substrate 101 and an edge of the orthographic projection of the third anode 1132 on the base substrate 101 ranges from 1 to 3 microns.

At least one embodiment of the present disclosure further provides a display substrate, as shown in FIG. 6, the display substrate includes: a base substrate 101; a plurality of sub-pixel groups 110; and a plurality of signal line groups 120. The plurality of signal line groups 120 are arranged along a first direction and are spaced apart from each other. Each of the signal line groups 120 includes a first signal line 121 and a second signal line 122. Both the first signal line 121 and the second signal line 122 extend along a second direction intersecting the first direction. In each of the signal line groups 120, the first signal line 121 and the second signal line 122 are sequentially arranged, and arrangement orders of the first signal line 121 and the second signal line 122 of two adjacent signal line groups 120 are the same. Each of the sub-pixel groups 120 includes a first sub-pixel 111, the first sub-pixel 111 includes a first anode 1110, and the first anode 1110 overlaps with two adjacent signal line groups 120.

For example, in some examples, as shown in FIG. 6, two adjacent signal line groups 120 include a first signal line group 1201 and a second signal line group 1202 arranged along a first direction, in the first signal line group 1201, the first signal line 121 is located on a side of the second signal line 122 away from the second signal line group 1202, and in the second signal line group 1202, the first signal line 121 is located on a side of the second signal line 122 close to the first signal line group 1201.

The following several statements should be noted:

(1) The accompanying drawings involve only the structure(s) in connection with the embodiment(s) of the present disclosure, and other structure(s) can be referred to common design(s).

(2) In case of no conflict, embodiments of the present disclosure and the features in the embodiments may be mutually combined to obtain new embodiments.

The above descriptions are only specific embodiments of the present disclosure, but the protection scope of the present disclosure is not limited thereto, those skilled in the art may make some variations or replacements within the technical scope of the present disclosure, and the variations and replacements should be within the protection scope of the present disclosure. Therefore, the protection scope of the present disclosure should be determined by the protection scope of the claims.

What is claimed is:

1. A display substrate, comprising:
   a base substrate;
   a plurality of sub-pixel groups; and
   a plurality of signal line groups, arranged along a first direction and spaced apart from each other, each signal line group of the plurality of signal line groups comprising two signal lines, and the two signal lines extending along a second direction intersecting the first direction,
   wherein each sub-pixel groups of the plurality of sub-pixel groups comprises a first sub-pixel, and the first sub-pixel comprises a first anode and a first effective light-emitting region, the first anode comprises a first main portion, and the first main portion at least partially overlaps with the first effective light-emitting region, a size of the first main portion in the first direction is larger than a size of the first main portion in the second direction,
   the two signal lines in each signal line group of the plurality of signal line groups comprises a first signal line and a second signal line which are sequentially arranged along the first direction, the first signal line and the second signal line in each signal line group of the plurality of signal line groups have the same arrangement order in the first direction,
   the first anode simultaneously overlaps with two adjacent signal line groups of the plurality of signal line groups in a direction perpendicular to the base substrate, the two adjacent signal line groups overlapping the first anode comprise a first signal line group and a second signal line group arranged along the first direction, and the first anode simultaneously overlaps with the first signal line and the second signal line of the first signal line group and the first signal line and the second signal line of the second signal line group in the direction perpendicular to the base substrate, a distance between the first signal line and the second signal line in each signal line group of the plurality of signal line groups is less than a distance between the two adjacent signal line groups overlapping with the first anode, and
   positions at which the two adjacent signal line groups overlapping with the first anode are located are at two sides of a center of the first main portion in the first direction,
   in each signal line group of the plurality of signal line groups, the first signal line is a data line configured to transmit a data signal, and the second signal line is a power line configured to transmit a driving voltage,
   in each signal line group of the plurality of signal line groups, a width of the first signal line is smaller than a width of the second signal line,
   the display substrate comprises a plurality of pixel driving circuits, each pixel driving circuit of the plurality of pixel driving circuits comprises a capacitor, the capacitor comprises a first electrode and a second electrode,
   an orthographic projection of the first anode on the base substrate is simultaneously overlapped with orthographic projections of the second electrodes of two adjacent pixel driving circuits of the plurality of pixel driving circuits, the two adjacent pixel driving circuits being adjacent in the first direction on the base substrate.

2. The display substrate according to claim 1, wherein the display substrate further comprises:
   a pixel defining layer on a side of the first anode away from the base substrate and comprising a first opening,
   wherein the first sub-pixel further comprises a first light-emitting layer, the first opening exposes the first anode, at least a portion of the first light-emitting layer is in the first opening and covers a portion of the first anode that is exposed, and a region defined by the first opening is the first effective light-emitting region of the first sub-pixel,
   the first main portion overlaps with the first effective light-emitting region, a ratio of the size of the first main portion in the first direction to the size of the first main portion in the second direction is $\gamma 1$, and a value of $\gamma 1$ ranges from 1.2 to 3.

3. The display substrate according to claim 1, wherein orthographic projections of the first signal line and the second signal line of the first signal line group and the first signal line and the second signal line of the second signal line group overlapping with the first anode on the base substrate extend along the second direction and pass through the orthographic projection of the first anode on the base substrate.

4. The display substrate according to claim 1, wherein each signal line of the two signal lines in each signal line group of the plurality of signal line groups comprises a terminal connected to an external driving circuit.

5. The display substrate according to claim 1, wherein the positions at which the two adjacent signal line groups overlapping with the first anode are located are at two ends of the first main portion in the first direction.

6. The display substrate according to claim 5, wherein the positions at which the two adjacent signal line groups overlapping with the first anode are located are substantially axisymmetric with respect to a first bisector of the first main portion, and the first bisector is parallel to the second direction.

7. The display substrate according to claim 1, wherein the first signal line of the first signal line group is on a side of the second signal line of the first signal line group away from the second signal line group, and the first signal line of the second signal line group is on a side of the second signal line of the second signal line group close to the first signal line group.

8. The display substrate according to claim 1, wherein the first anode is electrically connected with one a first pixel driving circuit of the plurality of pixel driving circuits corresponding to the first sub-pixel,
   the data line and the power line in the first signal line group are connected with the first pixel driving circuit and the data line and the power line in the second signal line group are connected with another pixel driving circuit of the plurality of pixel driving circuits.

9. The display substrate according to claim 1, wherein each sub-pixel group of the plurality of sub-pixel groups further comprises a second sub-pixel, the second sub-pixel comprises a second anode, and the second anode overlaps with the two adjacent signal line groups.

10. The display substrate according to claim 9, wherein orthographic projections of the two signal line groups overlapping with the second anode on the base substrate extend along the second direction and pass through an orthographic projection of the second anode on the base substrate.

11. The display substrate according to claim 9, wherein the second sub-pixel comprises a second effective light-emitting region, the second anode comprises a second main portion, and the second main portion at least partially overlaps with the second effective light-emitting region, a size of the second main portion in the first direction is larger than a size of the second main portion in the second direction, positions at which the two adjacent signal line groups overlapping with the second anode are located are at two ends of the second main portion in the first direction.

12. The display substrate according to claim 11, wherein the positions at which the two adjacent signal line groups overlapping with the second anode are located are substantially axisymmetric with respect to a second bisector of the second main portion, and the second bisector is parallel to the second direction.

13. The display substrate according to claim 9, wherein each sub-pixel group of the plurality of sub-pixel groups further comprises a third sub-pixel pair, the third sub-pixel pair comprises two third sub-pixels, each third sub-pixel of the two third sub-pixels comprises a third anode, and each of the third anodes overlaps with a respective signal line group of the two adjacent signal line groups.

14. The display substrate according to claim 13, wherein orthographic projections of the two adjacent signal line groups on the base substrate extend along the second direction and pass through an orthographic projection of each of the third anodes of the third sub-pixel pair on the base substrate.

15. The display substrate according to claim 13, wherein each third sub-pixels of the third sub-pixel pair comprises a third effective light-emitting region, each of the third anodes of the third sub-pixel pair comprises a third main portion, and the third main portion at least partially overlaps with the respective third effective light-emitting region, and two adjacent signal line groups are axisymmetric with respect to a third bisector of a line connecting centers of the third main portions of the third anodes of the third sub-pixel pair, and the third bisector is parallel to the second direction.

16. The display substrate according to claim 13, wherein, in each sub-pixel group of the plurality of sub-pixel groups, the first sub-pixel, the second sub-pixel and the third sub-pixel pair are arranged along the second direction, the two third sub-pixels in the third sub-pixel pair are arranged along the first direction, the sub-groups of plurality of sub-pixel groups are arranged along the second direction to form a plurality of sub-pixel group columns, and are arranged along the first direction to form a plurality of sub-pixel group rows, and two adjacent sub-pixel group columns of the plurality of sub-pixel group columns are misaligned by ½ pitch, and the pitch is equal to a distance between centers of two of the first sub-pixels of two adjacent sub-pixel groups in the second direction.

17. The display substrate according to claim 9, wherein the second anode is electrically connected with a second pixel driving circuit of the plurality of pixel driving circuits corresponding to the second sub-pixel, an orthographic projection of the second anode on the base substrate is spaced apart from orthographic projections of the first electrode and the second electrode of the second pixel driving circuit on the base substrate.

18. The display substrate according to claim 1, further comprising:

a planarization layer between a film layer in which the plurality of signal line groups are located and a film layer in which the first anode is located, wherein a height of each of the signal line groups in the direction perpendicular to the base substrate ranges from 650 nm to 850 nm, and a thickness of the planarization layer ranges from 1.4 μm to 1.6 μm.

19. A display device, comprising the display substrate according to claim 1.

\* \* \* \* \*